(12) United States Patent
Shin et al.

(10) Patent No.: US 10,761,630 B2
(45) Date of Patent: Sep. 1, 2020

(54) SUBSTRATE FOR DISPLAY DEVICE, DISPLAY DEVICE, AND TOUCH PANEL

(71) Applicant: SAMSUNG DISPLAY CO., LTD., Yongin-si, Gyeonggi-do (KR)

(72) Inventors: Hyuneok Shin, Gwacheon-si (KR); Dokeun Song, Yongin-si (KR); Sangwon Shin, Yongin-si (KR); Dongmin Lee, Anyang-si (KR); Hyunju Kang, Yongin-si (KR); Chanwoo Yang, Siheung-si (KR); Juhyun Lee, Seongnam-si (KR); Gwangmin Cha, Hwaseong-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 365 days.

(21) Appl. No.: 15/642,580

(22) Filed: Jul. 6, 2017

(65) Prior Publication Data

US 2018/0011579 A1 Jan. 11, 2018

(30) Foreign Application Priority Data

Jul. 7, 2016 (KR) .................. 10-2016-0086213

(51) Int. Cl.
*H01L 51/52* (2006.01)
*G06F 3/041* (2006.01)
*G02F 1/1333* (2006.01)
*G02F 1/1343* (2006.01)
*G06F 3/044* (2006.01)

(52) U.S. Cl.
CPC ........ *G06F 3/0412* (2013.01); *G02F 1/13338* (2013.01); *G02F 1/13439* (2013.01); *G02F 1/133305* (2013.01); *G02F 1/134309* (2013.01); *G06F 3/044* (2013.01); (Continued)

(58) Field of Classification Search
CPC ............................................. H01L 51/52–5215
See application file for complete search history.

(56) References Cited

U.S. PATENT DOCUMENTS

2012/0319057 A1\* 12/2012 Ikisawa ................. C04B 35/457
252/520.1
2013/0207138 A1 8/2013 Kashiwabara et al.
(Continued)

FOREIGN PATENT DOCUMENTS

JP 2001-098359 A 4/2001
JP 2008-218427 A 9/2008

*Primary Examiner* — Moazzam Hossain
*Assistant Examiner* — Hajar Kolahdouzan
(74) *Attorney, Agent, or Firm* — Kile Park Reed & Houtteman PLLC

(57) ABSTRACT

A display substrate, a display device, and a touch panel, the display substrate including a base substrate; and an electrode on the base substrate, the electrode including a first light transmitting layer, wherein the first light transmitting layer has a work function ranging from about 4.75 eV to about 4.9 eV, the first light transmitting layer includes a first transparent conductive oxide (TCO) layer and a first metal element doped in the first transparent conductive oxide layer, the first metal element being a group 2 metal element, the first metal element is included in the first light transmitting layer in an amount of about 0.01 atomic percent (atomic %) to about 5.00 atomic %, based on a total number of atoms in the first light transmitting layer.

25 Claims, 15 Drawing Sheets

(52) U.S. Cl.
CPC .................. *H01L 51/5215* (2013.01); *G06F 2203/04102* (2013.01); *G06F 2203/04111* (2013.01)

(56) References Cited

U.S. PATENT DOCUMENTS

2014/0239287 A1* 8/2014 Lee .................... H01L 51/5004
                                                                 4/40
2016/0042702 A1* 2/2016 Hirakata ............. H01L 27/3269
                                                                 345/205

* cited by examiner

SUBSTRATE FOR DISPLAY DEVICE, DISPLAY DEVICE, AND TOUCH PANEL

CROSS-REFERENCE TO RELATED APPLICATION

Korean Patent Application No. 10-2016-0086213, filed on Jul. 7, 2016, in the Korean Intellectual Property Office, and entitled: "Substrate for Display Device, Display Device, and Touch Panel," is incorporated by reference herein in its entirety.

BACKGROUND

1. Field

Embodiments relate to a display substrate, a display device, and a touch panel.

2. Description of the Related Art

Organic light emitting diode ("OLED") display devices, liquid crystal display ("LCD") devices, electrophoretic display ("EPD") devices, and touch panels may include a transparent electrode having light transmittance.

A transparent electrode may include transparent conductive oxide ("TCO") layer.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Embodiments are directed to a display substrate, a display device, and a touch panel.

The embodiments may be realized by providing a display substrate, including a base substrate; and an electrode on the base substrate, the electrode including a first light transmitting layer, wherein the first light transmitting layer has a work function ranging from about 4.75 eV to about 4.9 eV, the first light transmitting layer includes a first transparent conductive oxide (TCO) layer and a first metal element doped in the first transparent conductive oxide layer, the first metal element being a group 2 metal element, the first metal element is included in the first light transmitting layer in an amount of about 0.01 atomic percent (atomic %) to about 5.00 atomic %, based on a total number of atoms in the first light transmitting layer.

The first transparent conductive oxide layer may include indium tin oxide (ITO), indium zinc oxide (IZO), zinc oxide (ZnO), aluminum zinc oxide (AZO), or indium oxide ($In_2O_3$).

The first transparent conductive oxide layer may include about 85 percentage by weight (wt %) to about 95 wt % of $In_2O_3$, and about 5 wt % to about 15 wt % of $SnO_2$, based on a total weight of the first transparent conductive oxide layer.

The group 2 metal element may include Be, Mg, or Ca.

The first light transmitting layer may have a sheet resistance ranging from about 30 Ω/square to about 55.0 Ω/square.

The first light transmitting layer may have a thickness ranging from about 5 nanometers (nm) to about 10 nm.

The first light transmitting layer may have a refractive index ranging from about 1.6 to about 1.9.

The first light transmitting layer may have a transmittance ranging from about 90 percent (%) to about 99%.

The electrode may further include a metal layer between the base substrate and the first light transmitting layer, and the metal layer may include a metal or a metal alloy.

The metal layer may include silver (Ag).

The metal layer may further include zinc (Zn), copper (Cu), antimony (Sb), or indium (In).

The metal layer may have a thickness ranging from about 3 nm to about 7 nm.

The electrode may further include a second light transmitting layer between the base substrate and the metal layer, the second light transmitting layer may include a second transparent conductive oxide layer and a second metal element doped in the second transparent conductive oxide layer, the second metal element may be a group 2 metal element, and the second metal element may be included in the second light transmitting layer in an amount of about 0.01 atomic % to about 5.00 atomic %, based on a total number of atoms in the second light transmitting layer.

The second light transmitting layer may have a thickness ranging from about 5 nm to about 10 nm.

The embodiments may be realized by providing an organic light emitting diode including the display substrate according to an embodiment, wherein the electrode is an anode of the organic light emitting diode.

The embodiments may be realized by providing a display device including a base substrate; and a first electrode on the base substrate, the first electrode including a first light transmitting layer, wherein the first light transmitting layer has a work function ranging from about 4.75 eV to about 4.9 eV, the first light transmitting layer includes a first transparent conductive oxide (TCO) layer and a first metal element doped in the first transparent conductive oxide layer, the first metal element being a group 2 metal element, the first metal element is included in the first light transmitting layer in an amount of about 0.01 atomic percent (atomic %) to about 5.00 atomic %, based on a total number of atoms in the first light transmitting layer.

The first electrode may further include a metal layer between the base substrate and the first light transmitting layer, and the metal layer may include a metal or a metal alloy.

The first electrode may further include a second light transmitting layer between the base substrate and the metal layer, the second light transmitting layer may include a second transparent conductive oxide layer and a second metal element doped in the second transparent conductive oxide layer, the second metal element may be a group 2 metal element, and the second metal element may be included in the second light transmitting layer in an amount of about 0.01 atomic % to about 5.00 atomic %, based on a total number of atoms in the second light transmitting layer.

The display device may further include a light emitting layer on the first electrode; and a second electrode on the light emitting layer.

The first electrode may be an anode.

The display device may further include a thin film encapsulation layer on the second electrode.

The base substrate may be a flexible substrate.

The display device may further include an opposing substrate opposing the base substrate; and a liquid crystal layer between the base substrate and the opposing substrate.

The embodiments may be realized by providing a touch panel including a base substrate; a plurality of first sensor patterns on the base substrate and arranged along a direction; and a plurality of second sensor patterns on the base substrate, the plurality of second sensor patterns being insulated from and intersecting the first sensor pattern, wherein the first sensor pattern or the second sensor pattern includes a first light transmitting layer, the first light transmitting layer includes a first transparent conductive oxide layer and a first metal element doped in the first transparent conductive oxide layer, the first metal element being a group 2 metal element, the first metal element is included in the first light transmitting layer in an amount of about 0.01 atomic percent (atomic %) to about 5.00 atomic %, based on a total number of atoms in the first light transmitting layer.

The first sensor pattern may include a plurality of first sensor electrodes and a first bridge connecting adjacent ones of the first sensor electrodes, the second sensor pattern may include a plurality of second sensor electrodes and a second bridge connecting adjacent ones of the second sensor electrodes, and the first bridge may be insulated from and intersects the second bridge.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
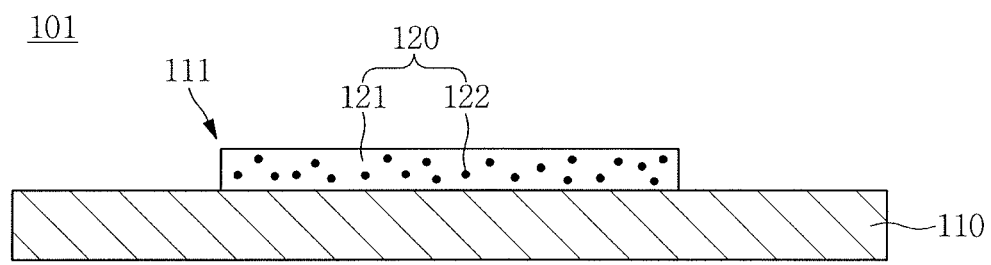
FIG. 1 illustrates a cross-sectional view of a display substrate according to a first exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. In addition, it will also be understood that when a layer is referred to as being "between" two layers, it can be the only layer between the two layers, or one or more intervening layers may also be present. Like reference numerals refer to like elements throughout.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof. As used herein, the term "or" is not an exclusive term, e.g., "A or B" would include A, B, or A and B.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, a first exemplary embodiment will be described with reference to FIG. 1.

FIG. 1 illustrates a cross-sectional view of a display substrate 101 according to a first exemplary embodiment.

The display substrate 101 according to the first exemplary embodiment may include a base substrate 110 and an electrode 111 on the base substrate 110. The electrode 111 may include a first light transmitting layer 120.

The first light transmitting layer 120 may include, e.g., a first transparent conductive oxide ("TCO") layer 121 and a first metal element 122 doped in the first TCO layer 121. In an implementation, the first metal element 122 may be, e.g., a group 2 metal element. In an implementation, the first metal element 122 may be included in the first light transmitting layer 120 in an amount of, e.g., about 0.01 atomic percent (atomic %) to about 5.00 atomic %, based on a total number of atoms in the first light transmitting layer 120 (or with respect to a total atomic weight of the first light transmitting layer 120). The atomic % denotes a percentage of the number of atoms, and is represented by a percentage of the number of corresponding atoms to the total number of atoms of a certain material. The atomic % may also be represented by at %.

The first TCO layer 121 may include, e.g., indium tin oxide (ITO), indium zinc oxide (IZO), zinc oxide (ZnO), aluminum zinc oxide (AZO), or indium oxide ($In_2O_3$).

Hereinafter, the first exemplary embodiment will be described with the first TCO layer 121 being ITO.

In an implementation, ITO may include $In_2O_3$ in an amount of about 85 percentage by weight (wt %) to about 95 wt % and $SnO_2$ in an amount of about 5 wt % to about 15 wt %. In an implementation, the composition ratio of ITO may vary based on a manufacturing condition and usage of a product.

The first metal element 122 may be a group 2 metal element. In an implementation, the group 2 metal element may include, e.g., Be, Mg, or Ca.

The group 2 metal element may help effectively reduce (or prevent) crystallization of the first TCO layer 121 in a process of deposition or sputtering.

In order to form the electrode 111 on the base substrate 110, TCO may be coated over an entire surface of the base substrate 110 to form a light transmitting layer, and the light transmitting layer may be patterned in a selective manner through etching. The TCO may be coated over the base substrate 110 through deposition or sputtering. If the TCO were to be crystallized, patterning of the light transmitting layer may not be readily or easily performed.

Water vapor ($H_2O$) could be sprayed on the TCO in order to help prevent or effectively reduce the TCO coated on the base substrate 110 from being crystallized. The water vapor ($H_2O$) may help effectively reduce crystallization of the TCO. However, due to the water vapor spray, a great amount of nodule-shaped particles could be generated on a surface of the light transmitting layer including TCO. For example, a surface roughness could undesirably increase. The nodule-shaped particles could affect another layer above or below the light transmitting layer and could cause defects of the electrode.

According to the first exemplary embodiment, in a process of forming the first light transmitting layer 120, a group 2 metal element may be doped in the first TCO layer 121. The group 2 metal element may help effectively reduce or prevent crystallization of the first TCO layer 121 in a process of deposition or sputtering. Accordingly, deposition or sputtering of the first TCO layer 121 may be performed without spraying water vapor ($H_2O$), and thus, undesirable generation of the nodule-shaped particles, which may be generated due to the water vapor spray, may be prevented.

The first TCO layer 121 doped with a group 2 metal element may be crystallized through thermal treatment after patterning, thus becoming or forming the first light transmitting layer 120. The first light transmitting layer 120 may have, e.g., high transmittance, low resistance, and high work function.

The first light transmitting layer 120 may have low sheet resistance. In an implementation, the first light transmitting layer 120 may have a sheet resistance of about 55.0 Ω/square (or Ω/□) or less, e.g., ranging from about 30 Ω/square to about 55.0 Ω/square. Although having a relatively small thickness, the first light transmitting layer 120 having a low sheet resistance may have excellent electrical conductivity. In an implementation, the first light transmitting layer 120 may have a small thickness, e.g., ranging from about 5 nanometers (nm) to about 10 nm.

The electrode 111 according to the first exemplary embodiment (which has such a small thickness) may be advantageous to achieve a thin film structure of a display device. In addition, when the above-described electrode 111 is used in a touch panel, a thickness of the touch panel may decrease. For example, such an electrode having a small thickness may be useful in flexible display devices.

In an implementation, a thickness of the first light transmitting layer 120 may vary, as desired. For example, based on the size of a device in which the first light transmitting layer 120 is used, the thickness of the first light transmitting layer 120 may vary.

In an implementation, the first light transmitting layer 120 may have a work function ranging from, e.g., about 4.75 eV to about 4.9 eV. In an implementation, the first light transmitting layer 120 has a higher work function than a work function, e.g., about 4.7 eV, of ITO.

Accordingly, the first light transmitting layer 120 may have excellent hole injection characteristics, and may be solely used as an anode of an organic light emitting diode ("OLED"). Accordingly, a thickness of the OLED may decrease. The OLED having a small thickness may be useful in flexible display devices.

In addition, the first light transmitting layer 120 doped with the group 2 metal element may have a high transmittance. In an implementation, the first light transmitting layer 120 may have a transmittance ranging from, e.g., about 90% to about 99%. The transmittance is also referred to as a "light transmittance."

The electrode 111 according to the first exemplary embodiment that includes the aforementioned first light transmitting layer 120 may be used as a transparent electrode of display devices or touch panels. For example, the electrode 111 according to the first exemplary embodiment may be used as an anode of OLEDs, a pixel electrode and/or a common electrode of liquid crystal display ("LCD") devices, or a touch sensor pattern of touch panels.

Hereinafter, a second exemplary embodiment will be described with reference to FIG. 2. Hereinafter, to avoid repetition, descriptions pertaining to configuration described hereinabove may be omitted.

Figure 2:
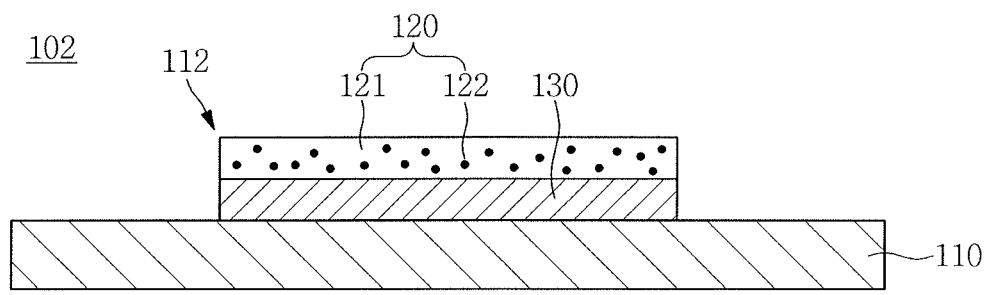
FIG. 2 illustrates a cross-sectional view of a display substrate according to a second exemplary embodiment.

FIG. 2 illustrates a cross-sectional view of a display substrate 102 according to the second exemplary embodiment.

Referring to FIG. 2, the display device 102 according to the second exemplary embodiment may include a base substrate 110 and an electrode 112 on the base substrate 110. The electrode 112 may include, e.g., a metal layer 130 and a first light transmitting layer 120 on the metal layer 130.

According to the second exemplary embodiment, the metal layer 130 may be between the base substrate 110 and the first light transmitting layer 120. In an implementation, the metal layer 130 may include, e.g., a metal (e.g., in elemental or metallic form) or a metal alloy. In an implementation, the metal layer 130 may include, e.g., silver (Ag). For example, the metal layer 130 may include Ag or Ag alloys.

In an implementation, the metal layer 130 may further include, e.g., zinc (Zn), copper (Cu), antimony (Sb), or indium (In). Zn, Cu, Sb, and In may help effectively impede (or prevent) agglomeration of Ag. Accordingly, the metal layer 130 including Ag or Ag alloys may be uniformly formed on the base substrate 110.

A thickness of the metal layer 130 may vary, as desired.

In an implementation, the metal layer 130 may have a thickness ranging from, e.g., about 3 nm to about 7 nm. In such an exemplary embodiment, the electrode 112 according to the second exemplary embodiment that includes the metal layer 130 and the first light transmitting layer 120 may be used as a transparent electrode. For example, the electrode 112 according to the second exemplary embodiment may be used as an anode of OLEDs, a pixel electrode and a common electrode of LCD devices, or a touch sensor pattern of touch panels.

In an implementation, the metal layer 130 may have a thickness ranging from, e.g., about 100 nm to about 300 nm. In such an exemplary embodiment, the electrode 112 that includes the metal layer 130 and the first light transmitting layer 120 may be used as a reflective electrode. In a case where the electrode 112 according to the second exemplary embodiment is used as a reflective-type anode of an OLED, an OLED display device having a small thickness may be realized.

Hereinafter, a third exemplary embodiment will be described with reference to FIG. 3.

Figure 3:
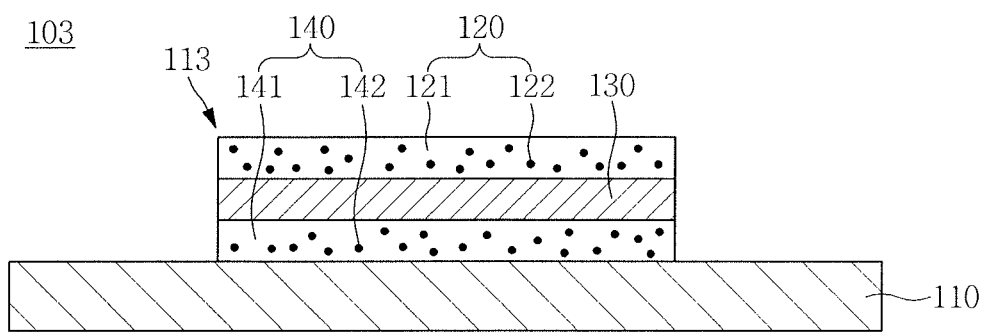
FIG. 3 illustrates a cross-sectional view of a display substrate according to a third exemplary embodiment.

FIG. 3 illustrates a cross-sectional view of a display substrate 103 according to the third exemplary embodiment.

Referring to FIG. 3, the display substrate 103 according to the third exemplary embodiment may include a base substrate 110 and an electrode 113 on the base substrate 110. The electrode 113 may include, e.g., a second light transmitting layer 140, a metal layer 130 on the second light transmitting layer 140, and a first light transmitting layer 120 on the metal layer 130.

In an implementation, the second light transmitting layer 140 may be between the base substrate 110 and the metal layer 130. In an implementation, the second light transmitting layer 140 may include, e.g., a second TCO layer 141 and a second metal element 142 doped in the second TCO layer 141. In an implementation, the second metal element 142 may be a group 2 metal element. In an implementation, the second metal element 142 may be included in the second light transmitting layer 140 in an amount of about 0.01 atomic % to about 5.00 atomic %, with respect to a total number of atoms in the second light transmitting layer 140.

In an implementation, the second light transmitting layer 140 may be the same as the first light transmitting layer 120 or different from the first light transmitting layer 120. In an implementation, the second TCO layer 141 may be the same as the first TCO layer 121 or different from the first TCO layer 121. In an implementation, the second metal element 142 may be the same as the first metal element 122 or different from the first metal element 122.

In an implementation, the second light transmitting layer 140 may have a thickness ranging from, e.g., about 5 nm to about 10 nm.

In a case where the metal layer 130 has a thickness ranging from about 3 nm to about 7 nm, the electrode 113 according to the third exemplary embodiment may be used as a transparent electrode. For example, the electrode 113 according to the third exemplary embodiment may be used as an anode of OLEDs, a pixel electrode and a common electrode of LCD devices, or a touch sensor pattern of touch panels.

In an implementation, the metal layer 130 may have a thickness ranging from about 100 nm to about 300 nm, and the electrode 113 according to the third exemplary embodiment may be used as a reflective electrode of display devices, e.g., as a reflective anode of OLEDs.

Hereinafter, optical properties and electrical properties of the electrodes 111, 112, and 113 according to the first, second, and third exemplary embodiments will be described with reference to Production Examples and Comparative Examples.

The following Production Examples and Comparative Examples are provided in order to highlight characteristics of one or more embodiments, but it will be understood that the Production Examples and Comparative Examples are not to be construed as limiting the scope of the embodiments, nor are the Comparative Examples to be construed as being outside the scope of the embodiments. Further, it will be understood that the embodiments are not limited to the particular details described in the Production Examples and Comparative Examples.

Production Examples 1 to 6

Through sputtering targets of $In_2O_3$, $SnO_2$, and $MgO$, the electrode 111 having a thickness of about 55 nm (550 Å) was formed on a substrate including glass. The electrode 111 included the first light transmitting layer 120 and included ITO as the first TCO layer 121.

For example, $In_2O_3$ in an amount of about 90 wt % and $SnO_2$ in an amount of about 10 wt % were used to form ITO, and magnesium (Mg) in an amount of about 1 atomic % with respect to the total atomic weight of ITO was used (e.g., as a dopant).

In a sputtering process to form the first light transmitting layer 120, oxygen (O$_2$) gas was supplied at flow rates of 0 sccm, 0.4 sccm, 0.8 sccm, 1.2 sccm, 1.6 sccm, and 2.0 sccm. Electrodes manufactured corresponding to respective oxygen gas flow rates are referred to as Production Example 1 (0 sccm), Production Example 2 (0.4 sccm), Production Example 3 (0.8 sccm), Production Example 4 (1.2 sccm), Production Example 5 (1.6 sccm), and Production Example 6 (2.0 sccm), respectively.

Comparative Examples 1 and 2

An electrode that included ITO and formed on a substrate, including glass, through sputtering targets or In$_2$O$_3$ and SnO$_2$, (omitting a target of MgO), is referred to as Comparative Example 1. In such an example, In$_2$O$_3$ in an amount of about 90 wt % and SnO$_2$ in an amount of about 10 wt % were used, and in a process of forming an ITO electrode, water vapor (H$_2$O) was supplied at about 1.5 sccm and oxygen (O$_2$) gas was supplied at about 0.5 sccm. The electrode according to Comparative Example 1 had a thickness of about 55 nm (550 Å).

An electrode that included IZO and formed on a substrate, including glass, through sputtering targets of In$_2$O$_3$ and ZnO, (omitting a target of MgO), is referred to as Comparative Example 2. In such an example, In$_2$O$_3$ in an amount of about 90 wt % and ZnO in an amount of about 10 wt % were used, and in a process of forming an IZO electrode, water vapor (H$_2$O) was supplied at about 1.5 sccm and oxygen (O$_2$) gas was supplied at about 0.5 sccm. The electrode according to Comparative Example 2 had a thickness of about 55 nm (550 Å).

[Material Property Evaluation]

In regard to manufacturing of the electrodes according to Production Examples 1 to 6, sputtering of ITO was performed without water vapor spray. Accordingly, nodule-shaped particles that could otherwise occur due to water vapor spray were not generated on surfaces of the electrodes according to Production Examples 1 to 6.

Accordingly, the electrodes according to Production Examples 1 to 6 had low surface roughness and excellent evenness, thus having excellent optical and electrical properties.

In order to measure transmittance and sheet resistance, the electrodes according to Comparative Examples 1 and 2 and Production Examples 1 to 6 were thermal-treated for about 30 minutes at a temperature of about 230° C.

Transmittance and sheet resistance of the electrodes that were crystallized through thermal treatment were measured.

Figure 4:
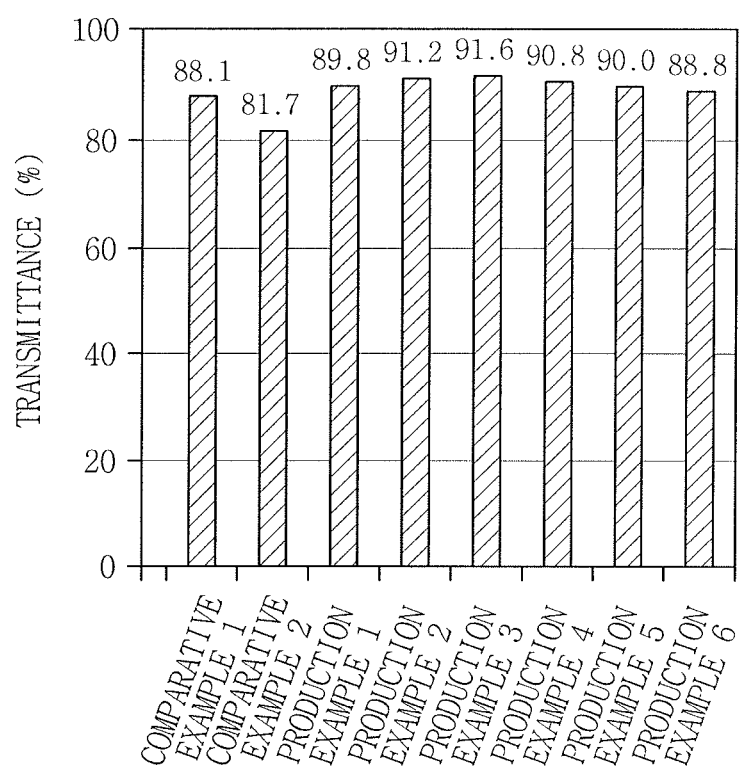
FIG. 4 illustrates a graph of transmittances of electrodes according to Production Examples and Comparative Examples.

FIG. 4 illustrates a graph of transmittances of the electrodes according to Production Examples 1 to 6 and Comparative Examples 1 and 2. Herein, a transmittance of a light having a wavelength of about 550 nm was measured. Referring to FIG. 4, the electrodes according to Production Examples 1 to 6 had higher transmittances than those of the electrodes according to Comparative Examples 1 and 2 by about 2% or more.

Figure 5:
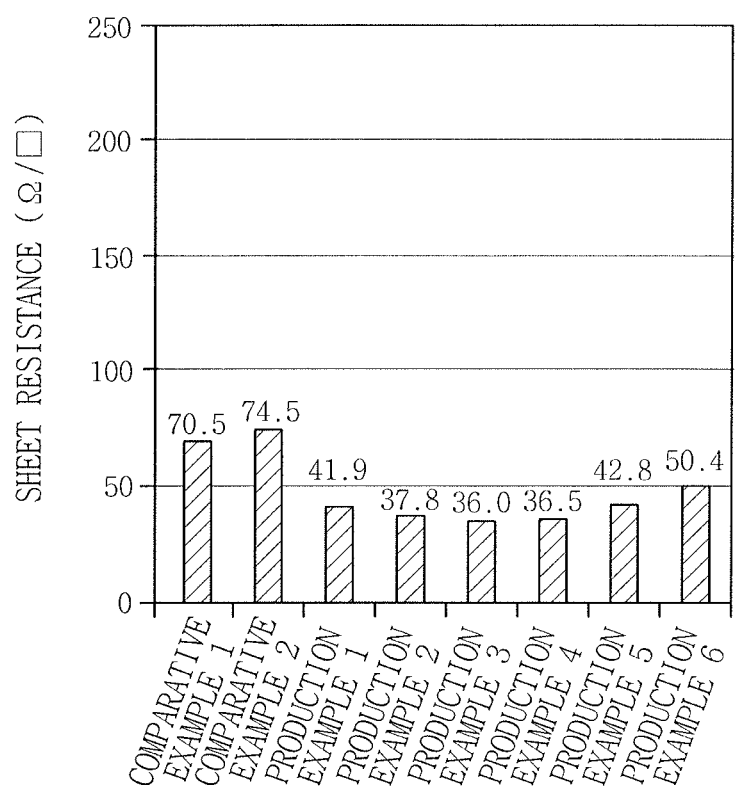
FIG. 5 illustrates a graph of sheet resistances of electrodes according to Production Examples and Comparative Examples.

FIG. 5 illustrates a graph of sheet resistances of the electrodes according to Production Examples 1 to 6 and Comparative Examples 1 and 2. Referring to FIG. 5, the electrodes according to Production Examples 1 to 6 had lower sheet resistances than those of the electrodes according to Comparative Examples 1 and 2 by about 30% to about 45%. For example, the electrodes according to Production Examples 1 to 6 had excellent electrical conductivity as compared to those of the electrodes according to Comparative Examples 1 and 2.

Figure 6A:
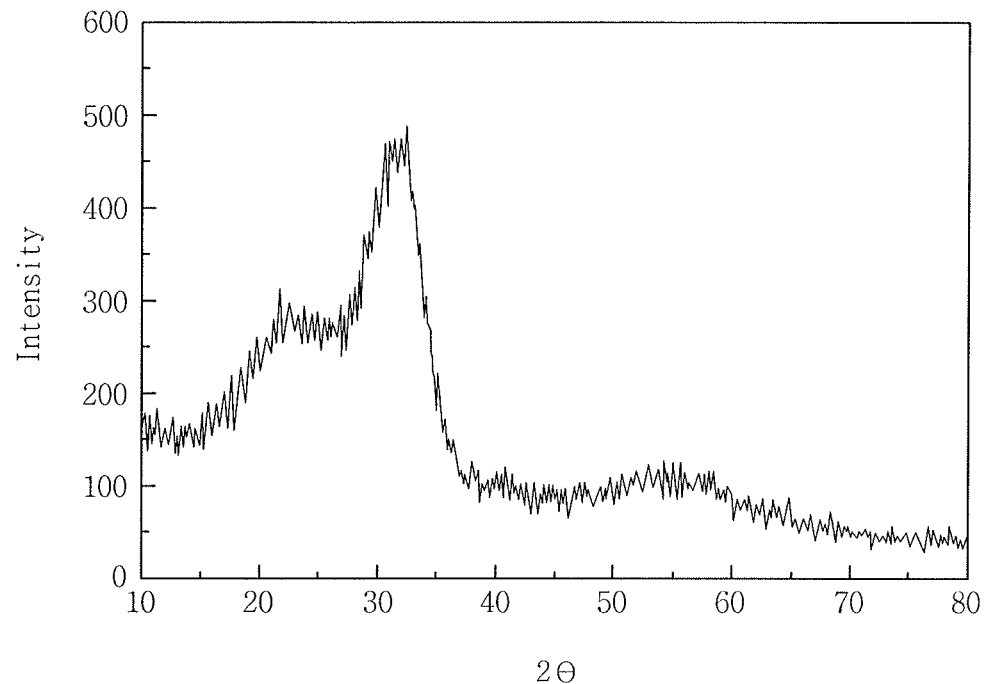
FIGS. 6A and 6B illustrate graphs of X-ray diffraction analysis ("XRD") of an electrode before thermal treatment.
Figure 6B:
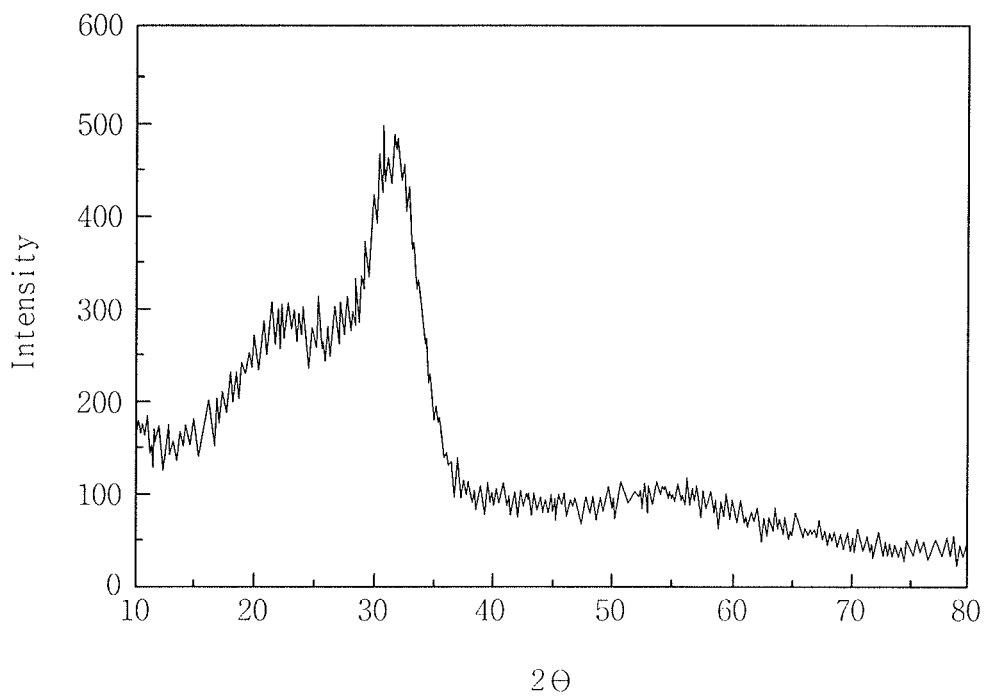

FIGS. 6A and 6B illustrate graphs of X-ray diffraction analysis ("XRD") of an electrode before thermal treatment. For example, FIG. 6A illustrates a graph of XRD of the electrode according to Comparative Example 1 before thermal treatment, and FIG. 6B illustrates a graph of XRD of the electrode according to Production Example 1 before thermal treatment.

The graph illustrated in FIG. 6B exhibits characteristics of an amorphous phase that does not have a peak as in the graph illustrated in FIG. 6A, which means that the electrode according to Production Example 1 before thermal treatment had an amorphous phase. Accordingly, the electrode according to Production Example 1 before thermal treatment may be readily patterned through etching. For example, the electrode according to Production Example 1 had excellent pattern-forming characteristics.

Figure 7A:
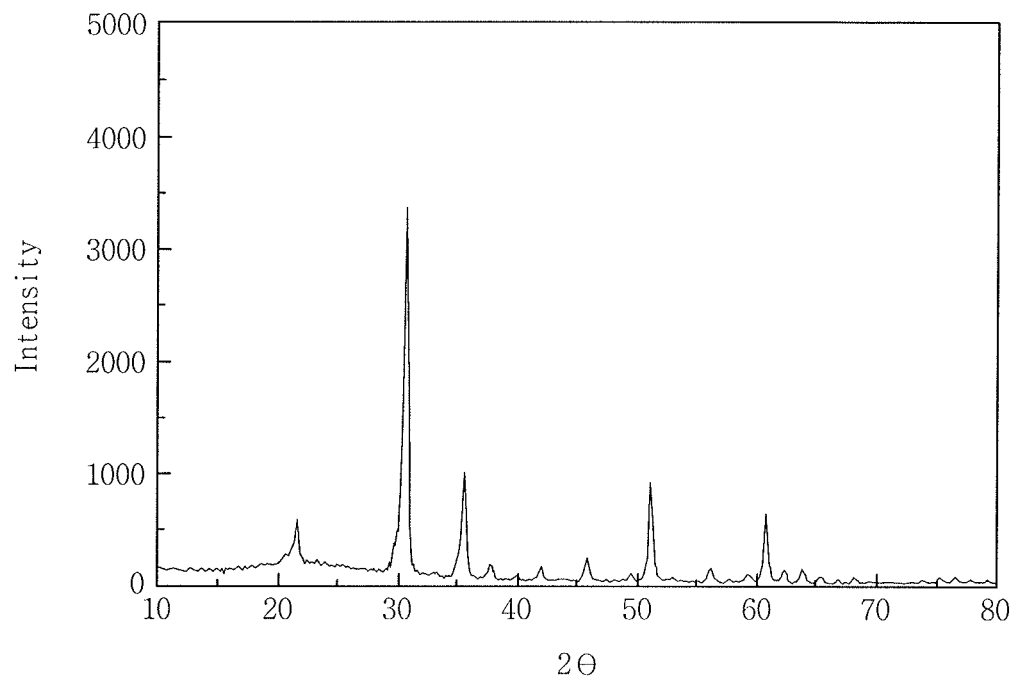
FIGS. 7A and 7B illustrate graphs of XRD of an electrode after thermal treatment.
Figure 7B:
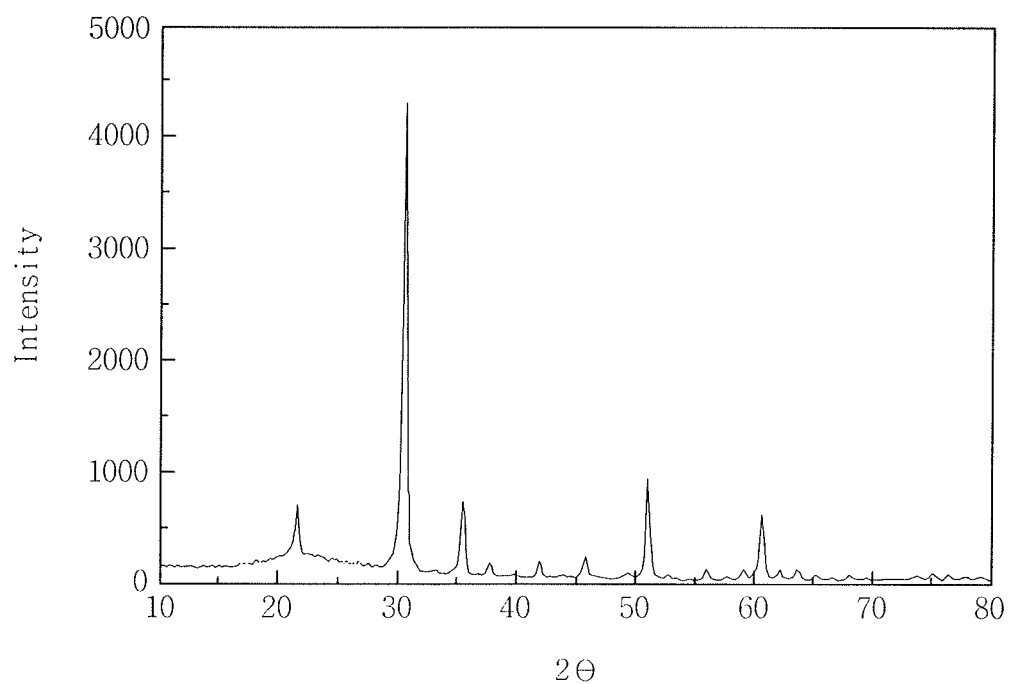

FIGS. 7A and 7B illustrate graphs of XRD of an electrode after thermal treatment. For example, FIG. 7A illustrates a graph of XRD of the electrode according to Comparative Example 1 after thermal treatment, and FIG. 7B illustrates a graph of XRD of the electrode according to Production Example 1 after thermal treatment. The thermal treatment was performed for about 30 minutes at a temperature of about 230° C.

The graph illustrated in FIG. 7B exhibits characteristics of a crystalline phase that has a peak as in the graph illustrated in FIG. 7A, which means that the electrode according to Production Example 1 crystallized as a result of the thermal treatment.

In an implementation, the TCO, e.g., ITO or IZO, may be affected by an insulating layer. For example, through contact with the insulating layer, material properties of an electrode including TCO may vary.

In order to verify or observe a change in material properties of an electrode due to an insulating layer, sheet resistance and transmittance of an electrode formed on an insulating layer that includes glass, silicon nitride (SiNx), or an organic layer were measured.

Figure 8:
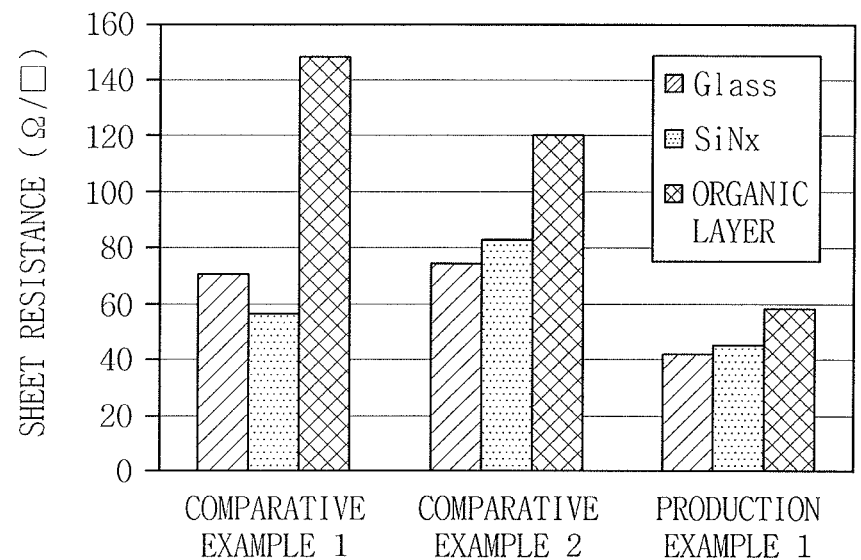
FIG. 8 illustrates a graph of sheet resistances of electrodes on an insulating layer.
Figure 9:
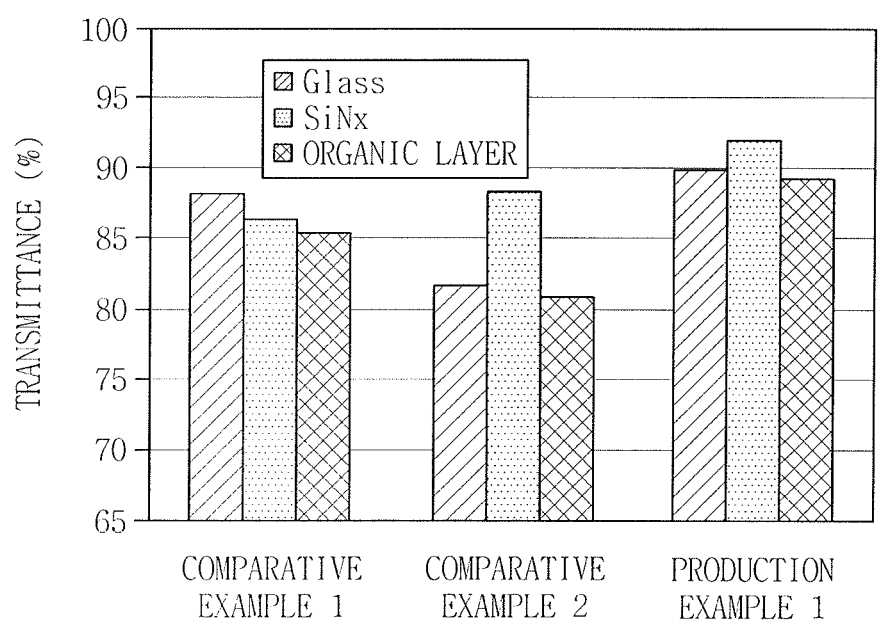
FIG. 9 illustrates a graph of transmittances of electrodes on an insulating layer.

FIG. 8 illustrates a graph of sheet resistances of electrodes on an insulating layer, and FIG. 9 illustrates a graph of transmittances of electrodes on an insulating layer.

For example, sheet resistances of the electrodes according to Comparative Example 1, Comparative Example 2, and Production Example 1 that were formed on an insulating layer including glass, silicon nitride (SiNx), or an organic layer are illustrated in FIG. 8.

Referring to FIG. 8, the electrodes according to Production Example 1 that were formed on insulating layers including glass, silicon nitride (SiNx), and an organic layer, respectively, had relatively low sheet resistances. For example, the electrode according to Production Example 1 (that was formed on an organic layer) had a lower sheet resistance than those of the electrodes according to Comparative Examples 1 and 2 (that were formed on organic layers) by about 50% or more. As such, the electrode according to an embodiment may have excellent electrical conductivity even on an organic layer.

In addition, transmittances of the electrodes according to Comparative Example 1, Comparative Example 2, and Production Example 1 that were formed on an insulating layer including glass, silicon nitride (SiNx), or an organic layer are illustrated in FIG. 9.

Referring to FIG. 9, although disposed on an insulating layer including glass, silicon nitride (SiNx), or an organic layer, the electrode according to Production Example 1 had excellent transmittance.

Figure 10:
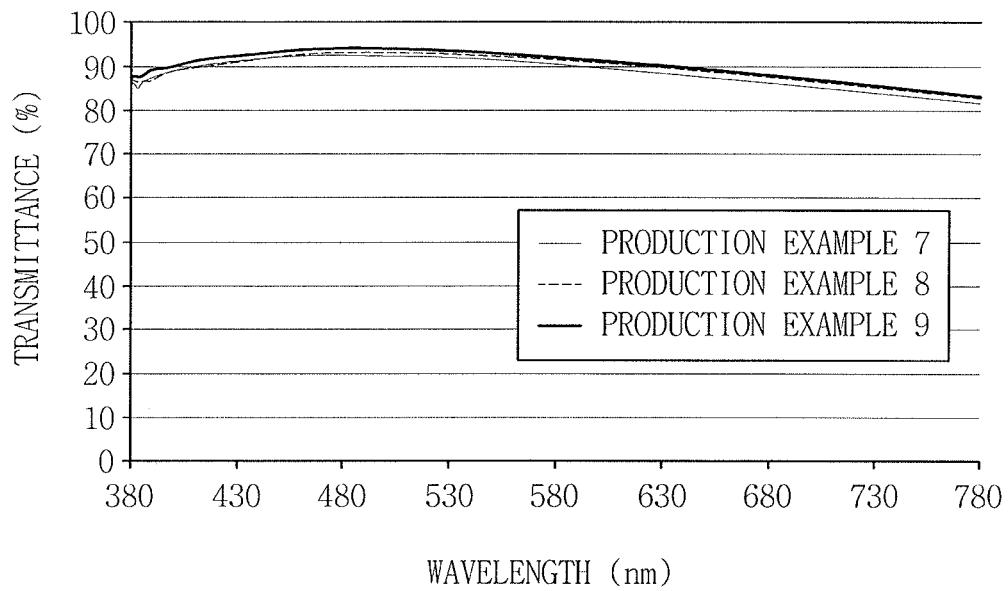
FIG. 10 illustrates a graph of transmittances of electrodes based on wavelength.

FIG. 10 illustrates a graph of transmittances of electrodes based on wavelength. For example, FIG. 10 illustrates transmittance of the electrode 113 that has a triple layer structure.

In order to measure a transmittance, the second light transmitting layer 140 having a thickness of about 7 nm (70 Å) was formed on a substrate including glass through sputtering targets of $In_2O_3$, $SnO_2$, and MgO. In such an exemplary embodiment, $In_2O_3$ in an amount of about 90 wt % and $SnO_2$ in an amount of about 10 wt % were used to form ITO, and Mg in an amount of about 1 atomic % (with respect to a total number of atoms in the layer) was used (e.g., as the metal element dopant).

Subsequently, a metal layer 130 that includes Ag and having a thickness of about 4 nm (40 Å) was formed on the second light transmitting layer 140 through sputtering.

Subsequently, a first light transmitting layer 120 having a thickness of about 7 nm (70 Å) was formed on the metal layer 130 through sputtering targets of $In_2O_3$, $SnO_2$, and MgO such that the electrode 113 was formed. In such an exemplary embodiment, $In_2O_3$ in an amount of about 90 wt % and $SnO_2$ in an amount of about 10 wt % were used to form ITO, and Mg in an amount of about 1 atomic % (with respect to a total number of atoms in the layer) was used.

The electrode 113 manufactured in the above-described manner was thermal-treated. An electrode that was thermal-treated for about 30 minutes at about 230° C. is referred to as Production Example 7, an electrode that was thermal-treated for about 60 minutes at about 230° C. is referred to as Production Example 8, and an electrode that was thermal-treated for about 90 minutes at about 230° C. is referred to as Production Example 9.

Transmittances of the electrodes according to Production Examples 7, 8, and 9 were measured, which are represented in FIG. 10. Referring to FIG. 10, although wavelength of light varied, the electrodes according to Production Examples 7, 8, and 9 exhibited excellent transmittance of about 80% or higher.

As such, the electrodes 111, 112, and 113 according to the first, second, and third exemplary embodiments may have excellent electrical conductivity and light transmittance. Display devices including the electrodes 111, 112, and 113 according to the first, second, and third exemplary embodiments may have a relatively small thickness and exhibit excellent display properties. In addition, as light efficiency is increased, contrast properties of display devices may be improved.

Figure 11:
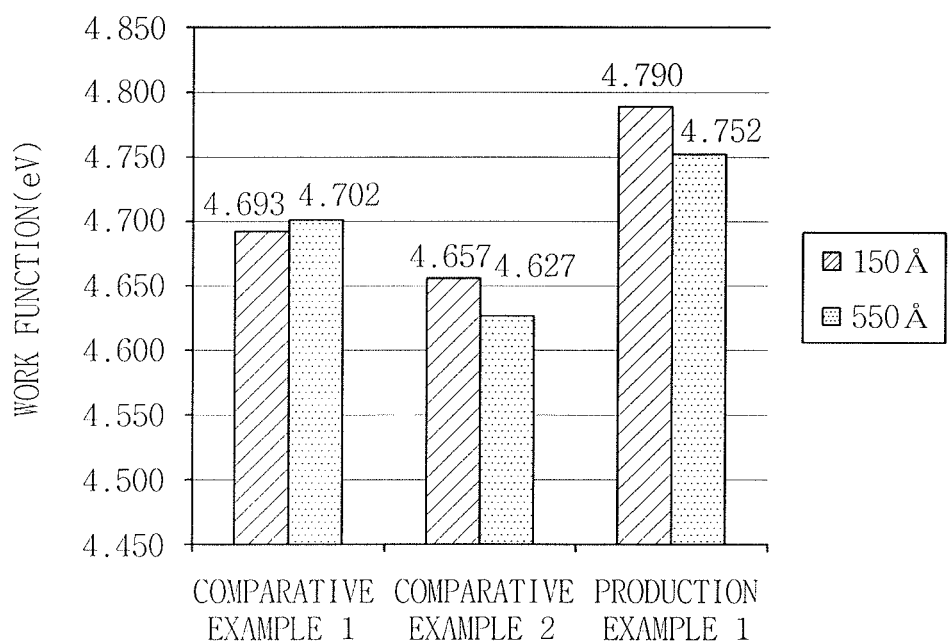
FIG. 11 illustrates a graph of work functions of electrodes based on thickness.

FIG. 11 illustrates a graph of work functions of electrodes based on thickness. For example, FIG. 11 illustrates work functions of the electrodes according to Comparative Example 1, Comparative Example 2, and Production Example 1, each having thicknesses of about 15 nm (150 Å) and 55 nm (550 Å).

Referring to FIG. 11, the electrode according to Production Example 1 had a work function of about 4.75 or higher. The electrode having such a high work function may have excellent hole injection properties, and thus may be capable of being used as an anode of an OLED. Accordingly, OLED display devices having a relatively simple structure and a relatively small thickness may be provided.

Hereinafter, display devices including the display substrates 101, 102, and 103 according to the first, second, and third exemplary embodiments will be described.

Figure 12:
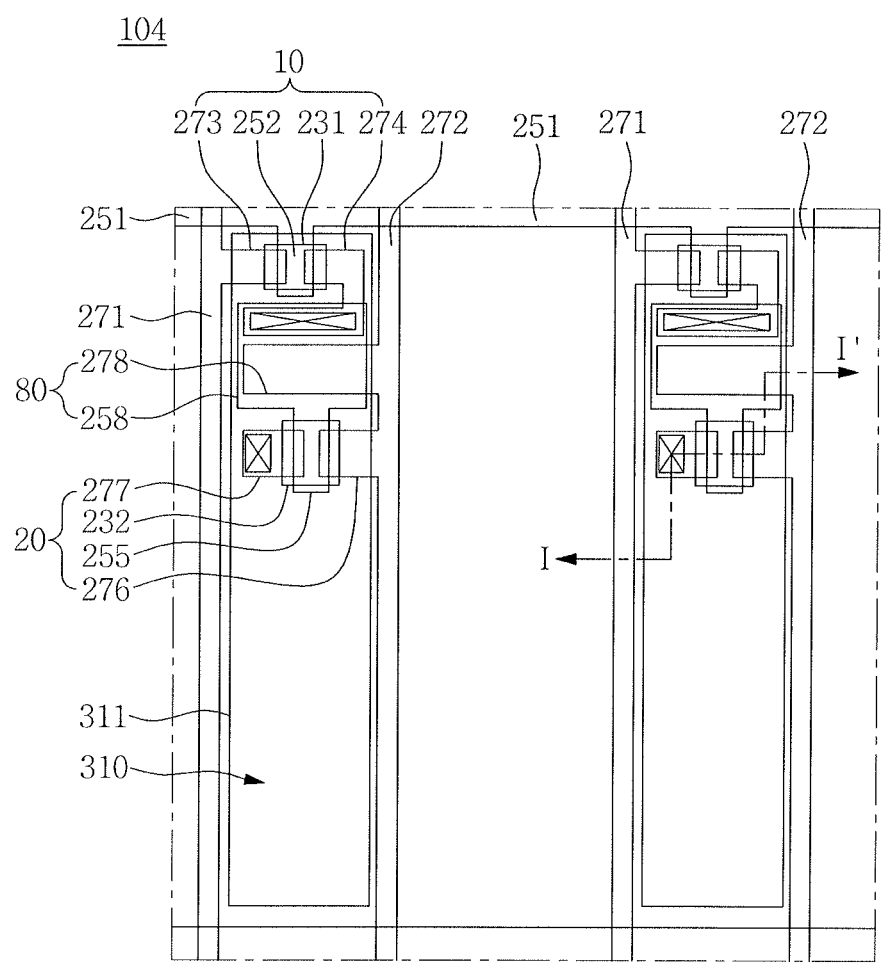
FIG. 12 illustrates a plan view of an organic light emitting diode ("OLED") display device according to a fourth exemplary embodiment.
Figure 13:
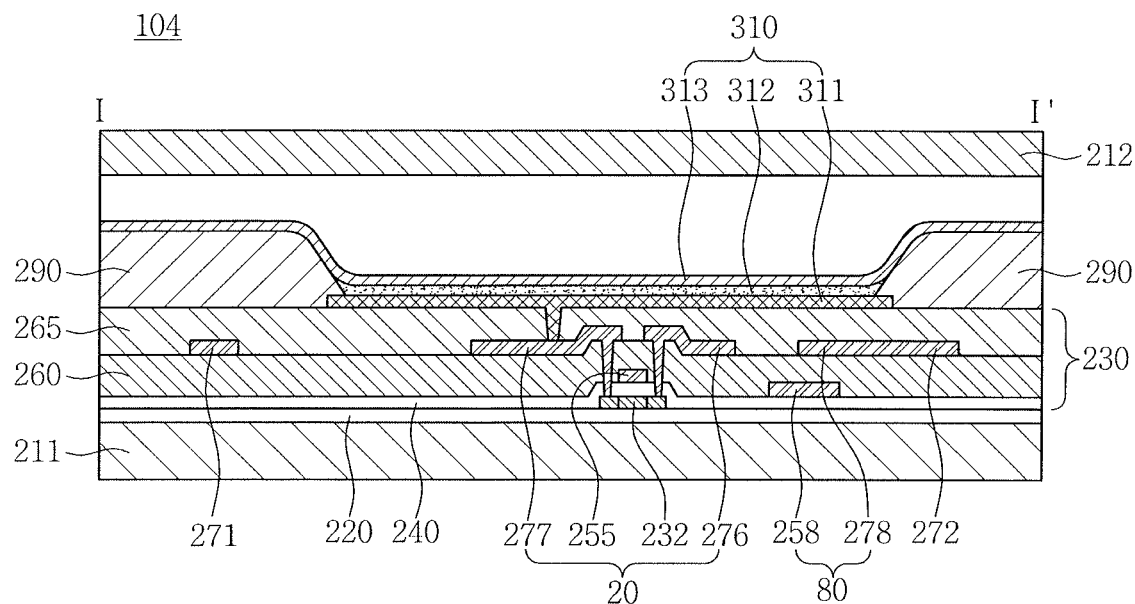
FIG. 13 illustrates a cross-sectional view taken along line I-I' of FIG. 12.

FIG. 12 illustrates a plan view of an OLED display device 104 according to a fourth exemplary embodiment. FIG. 13 illustrates a cross-sectional view taken along line I-I' of FIG. 12.

The OLED display device 104 according to the fourth exemplary embodiment may include a base substrate 211 and a first electrode 311 on the base substrate 211 and including a first light transmitting layer. In such an exemplary embodiment, the first light transmitting layer may include a first TCO and a first metal element doped in the first TCO. The first metal element is a group 2 metal element and is included in an amount of about 0.01 atomic % to about 5.00 atomic %, based on a total number of atoms in the first light transmitting layer.

For example, the OLED display device 104 according to the fourth exemplary embodiment may include the base substrate 211, a driving circuit unit 230, and an OLED 310.

The base substrate 210 may include an insulating material, e.g., glass, quartz, ceramic, plastic, or the like. In an implementation, the base substrate 211 may use a polymer film.

A buffer layer 220 may be disposed on the base substrate 211. The buffer layer 220 may include at least one layer of various inorganic layers and organic layers. In an implementation, the buffer layer 220 may be omitted.

The driving circuit unit 230 may be disposed on the buffer layer 220. The driving circuit unit 230 may include a plurality of thin film transistors ("TFTs") 10 and 20 and drives the OLED 310. For example, the OLED 310 may emit light based on a driving signal applied from the driving circuit unit 230, thereby displaying images.

FIGS. 12 and 13 illustrate an active matrix-type organic light emitting diode (AMOLED) display device 104 having a 2Tr-1Cap structure. For example, the 2Tr-1Cap structure may include two TFTs, e.g., the switching TFT 10 and the driving TFT 20, and the capacitor 80 in each pixel. For example, the OLED display device 104 may include three or more TFTs and two or more capacitors in each pixel, and may further include additional wirings. Herein, the term "pixel" refers to a smallest unit for displaying an image, and the OLED display device 104 displays an image using a plurality of pixels.

Each pixel may include the switching TFT 10, the driving TFT 20, the capacitor 80, and the OLED 310. In addition, a gate line 251 disposed along one direction and a data line 271 and a common power line 272 insulated from and intersecting the gate line 251 may be further disposed on the driving circuit unit 230. Each pixel may be defined by the gate line 251, the data line 271, and the common power line 272 as a boundary. In an alternative exemplary embodiment, pixels may be defined by a pixel defining layer or a black matrix.

The OLED 310 may include a first electrode 311, a light emitting layer 312 on the first electrode 311, and a second electrode 313 on the light emitting layer 312. The light emitting layer 312 may include a high molecular-weight organic material or a low molecular-weight organic material. Holes and electrons are respectively supplied from the first electrode 311 and the second electrode 313 into the light emitting layer 312 and then combined with each other therein to form an exciton. The OLED 310 may emit light by energy generated when the exciton falls from an excited state to a ground state.

The capacitor 80 may include a pair of capacitor plates 258 and 278 with an insulating interlayer 260 interposed therebetween. In such an exemplary embodiment, the insulating interlayer 260 may be a dielectric body. A capacitance of the capacitor 80 may be determined by electric charges accumulated in the capacitor 80 and a voltage across the pair of capacitor plates 258 and 278.

The switching TFT 10 may include a switching semiconductor layer 231, a switching gate electrode 252, a switching source electrode 273, and a switching drain electrode 274. The driving TFT 20 may include a driving semiconductor layer 232, a driving gate electrode 255, a driving source electrode 276, and a driving drain electrode 277. Further, a gate insulating layer 240 may further be provided to insulate the semiconductor layers 231 and 232 and the gate electrodes 252 and 255.

The switching TFT 10 may function as a switching element which selects a pixel to perform light emission. The switching gate electrode 252 may be connected to the gate line 251, and the switching source electrode 273 may be connected to the data line 271. The switching drain electrode 274 may be spaced apart from the switching source electrode 273 and connected to one of the capacitor plates, e.g., the capacitor plate 258.

The driving TFT 20 may apply a driving power, which allows the light emitting layer 312 of the OLED 310 in a selected pixel to emit light, to the first electrode 311 which is a pixel electrode. The driving gate electrode 255 may be connected to the capacitor plate 258 that is connected to the switching drain electrode 274. Each of the driving source electrode 276 and the other capacitor plate 278 may be connected to the common power line 272. The driving drain electrode 277 may be connected to the first electrode 311 of the OLED 310 through a contact hole defined in a planarization layer 265.

With the above-described structure, the switching TFT 10 is operated based on a gate voltage applied to the gate line 251 and serves to transmit a data voltage applied to the data line 271 to the driving TFT 20. A voltage equivalent to a difference between a common voltage applied to the driving TFT 20 from the common power line 272 and the data voltage transmitted by (or from) the switching TFT 10 is stored in the capacitor 80, and a current corresponding to the voltage stored in the capacitor 80 flows to the OLED 310 through the driving TFT 20 such that the OLED 310 may emit light.

According to the fourth exemplary embodiment, the first electrode 311 may be an anode and may have substantially a same structure as that of one of the electrodes according to first, second, and third exemplary embodiments.

For example, the first electrode 311 may include the first light transmitting layer 120 (the first exemplary embodiment). In an implementation, the first electrode 311 may further include the metal layer 130 below the first light transmitting layer 120 (the second exemplary embodiment), or may further include the second light transmitting layer 140 below the metal layer 130 (the third exemplary embodiment).

The first electrode 311 according to the fourth exemplary embodiment may be a transmissive electrode having light transmittance or may be a reflective electrode having light reflectance.

For example, in a case where the first electrode 311 includes the metal layer 130 (the second exemplary embodiment or the third exemplary embodiment), the first electrode 311 may become a transmissive electrode or a reflective electrode. In a case where the first electrode 311 is a reflective electrode, the metal layer 130 may have a thickness of about 100 nm or more. In a case where the first electrode 311 is a transmissive electrode, the metal layer 130 may have a thickness ranging from about 3 nm to about 7 nm.

The second electrode 313 may become a transflective layer or a reflective layer.

Light emitted from the light emitting layer 312 may be emitted outwards through the first electrode 311 or through the second electrode 313.

At least one of a hole injection layer HIL and a hole transport layer HTL may further be disposed between the first electrode 311 and the light emitting layer 312, and at least one of an electron transport layer ETL and an electron injection layer HTL may further be disposed between the light emitting layer 312 and the second electrode 313. The light emitting layer 312, the hole injection layer HIL, the hole transport layer HTL, the electron transport layer ETL, and the electron injection layer EIL may include or be formed of an organic material, and thus may be referred to as an organic layer.

A pixel defining layer 290 has an aperture. The aperture of the pixel defining layer 290 exposes a portion of the first electrode 311. The first electrode 311, the light emitting layer 312, and the second electrode 313 are sequentially stacked in the aperture of the pixel defining layer 290. In such an exemplary embodiment, the second electrode 313 may also be disposed on the pixel defining layer 290 as well as on the light emitting layer 312. In addition, the hole injection layer HIL, the hole transport layer HTL, the electron transport layer ETL, and the electron injection layer EIL may also be disposed between the pixel defining layer 290 and the second electrode 313. The OLED 310 emits light from the light emitting layer 312 in the aperture of the pixel defining layer 290. As such, the pixel defining layer 290 may define a light emission area.

In an implementation, a capping layer may be disposed on the second electrode 313 in order to protect the OLED 310 from an external environment.

A window 212 may be disposed on the second electrode 313. The window 212, along with the base substrate 211, serves to seal the OLED 310. The window 212, similar to the base substrate 211, may include an insulating material, e.g., glass, quartz, ceramic, plastic, or the like.

Figure 14:
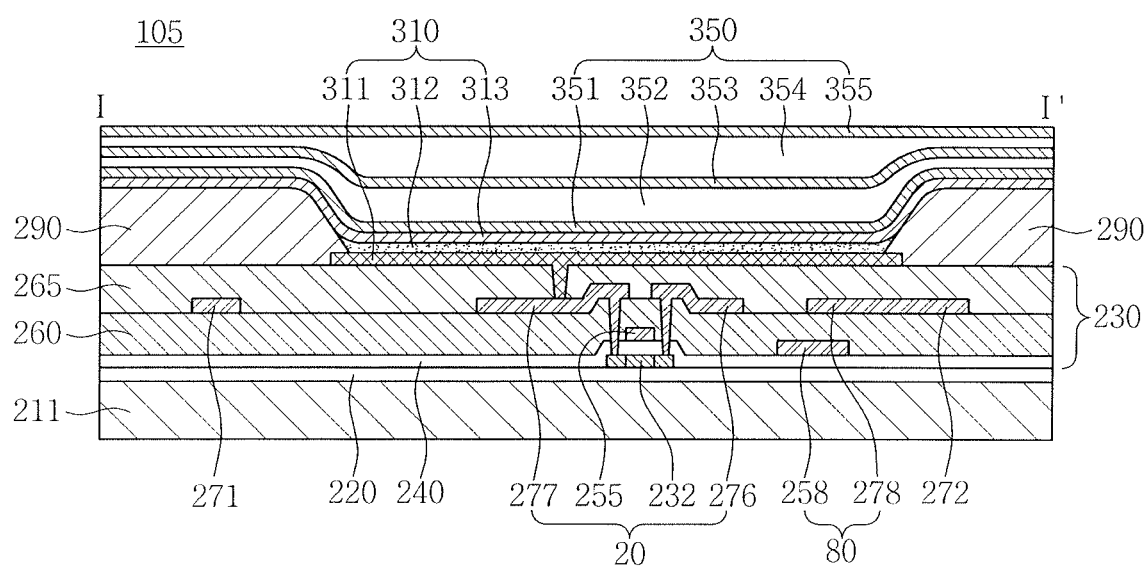
FIG. 14 illustrates a cross-sectional view of an OLED display device according to a fifth exemplary embodiment.

FIG. 14 illustrates a cross-sectional view of an OLED display device 105 according to a fifth exemplary embodiment. The OLED display device 105 according to the fifth exemplary embodiment may be a flexible display device and may include a thin film encapsulation layer 350 on a second electrode 313 and configured to protect an OLED 310. In an implementation, a base substrate 211 may use a flexible substrate. An example of the flexible substrate may include a polymer film.

The thin film encapsulation layer 350 may include one or more inorganic layers 351, 353, and 355 and one or more organic layers 352 and 354. The thin film encapsulation layer 350 may be configured to prevent or efficiently reduce infiltration of an external air, such as moisture or oxygen, into the OLED 310.

The thin film encapsulation layer 350 may have a structure where the inorganic layers 351, 353, and 355 and the organic layers 352 and 354 are alternately stacked. In an implementation, as illustrated in FIG. 14, the thin film encapsulation layer 350 may include three inorganic layers 351, 353, and 355 and two organic layers 352 and 354.

In an implementation, the inorganic layers 351, 353, and 355 may include one or more inorganic material of: $Al_2O_3$, $TiO_2$, $ZrO$, $SiO_2$, AlON, AlN, SiON, $Si_3N_4$, ZnO, and $Ta_2O_5$. The inorganic layers 351, 353, and 355 may be formed through methods such as a chemical vapor deposition (CVD) method or an atomic layer deposition (ALD) method. In an implementation, the inorganic layers 351, 353, and 355 may be formed using various methods.

In an implementation, the organic layers 352 and 354 may include a polymer-based material. In such an exemplary embodiment, the polymer-based material may include, e.g., an acrylic resin, an epoxy resin, polyimide, and polyethylene. In addition, the organic layers 352 and 354 may be formed through a thermal deposition process. The thermal deposition process for forming the organic layers 352 and 354 may be performed at a temperature range that may not damage the OLED 310. In an implementation, the organic layers 352 and 354 may be formed using various methods known to those skilled in the pertinent art.

The inorganic layers 351, 353, and 355 which have a high density of thin film may prevent or efficiently reduce infiltration of, mostly, moisture or oxygen. Infiltration of moisture and oxygen into the OLED 310 may be largely prevented by the inorganic layers 351, 353, and 355.

Moisture and oxygen that have passed through the inorganic layers 351, 353, and 355 may further be blocked by the organic layers 352 and 354. The organic layers 352 and 354 may have relatively low moisture-infiltration preventing efficacy, as compared to the inorganic layers 351, 353, and 355. However, the organic layers 352 and 354 may also serve as a buffer layer to reduce stress among respective ones of the inorganic layers 351, 353, and 355 and the organic layers 352 and 354, in addition to the moisture-infiltration preventing function. Further, the organic layers 352 and 354 have planarization characteristics, and an uppermost surface of the thin film encapsulation layer 350 may be planarized by the organic layers 352 and 354.

The thin film encapsulation layer 350 may have a thickness of about 10 µm or less. Accordingly, the OLED display device 105 may also have a small thickness. As such, as the thin film encapsulation layer 350 is applied, the OLED display device 105 may have excellent flexible characteristics.

Figure 15:
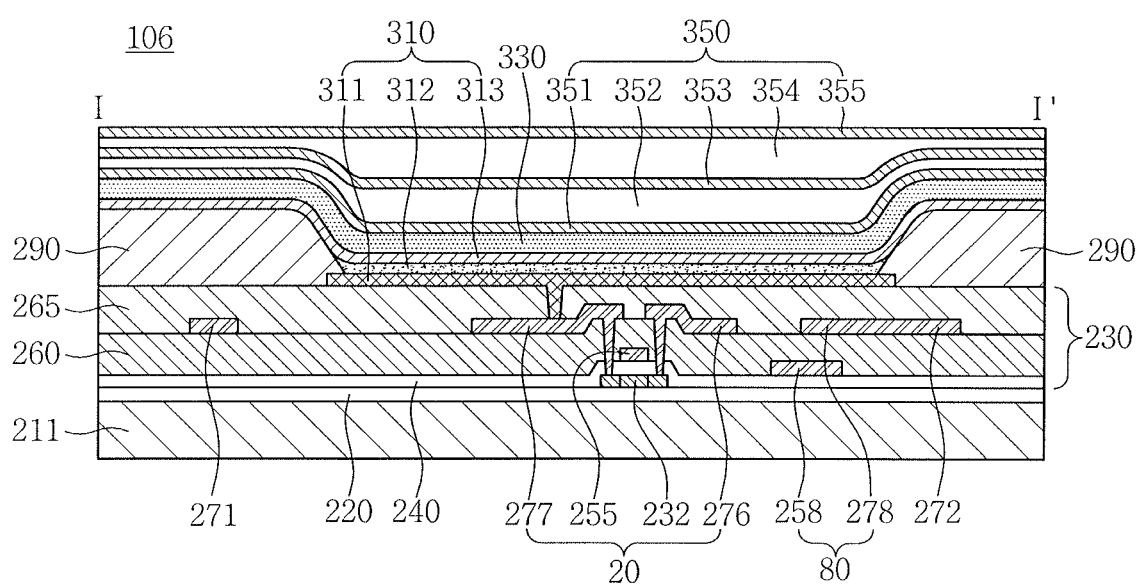
FIG. 15 illustrates a cross-sectional view of an OLED display device according to a sixth exemplary embodiment.

FIG. 15 illustrates a cross-sectional view of an OLED display device 106 according to a sixth exemplary embodiment.

The OLED display device 106 according to the sixth exemplary embodiment may include a capping layer 330 between an OLED 310 and a thin film encapsulation layer 350.

The capping layer 330 has light transmittance and serves to protect the OLED 310. The capping layer 330 may also serve to allow light emitted from a light emitting layer 312 to be emitted outwards efficiently.

The capping layer 330 may include at least one of an inorganic material and an organic material that have light transmittance. For example, the capping layer 330 may include an inorganic layer or an organic layer, or may include an organic layer including inorganic particles.

The capping layer 330 may have a thickness ranging from about 80 nm to about 300 nm, or may have a thickness of about 300 nm or more, e.g., ranging from about 300 nm to about 900 nm or more. As the capping layer 330 has a greater thickness, the OLED 310 may be well protected. However, when the capping layer 330 is thick, the OLED display device 106 may experience difficulty in achieving a thin film structure.

The capping layer 330 may be manufactured through methods known in the pertinent art. For example, the capping layer 330 may be manufactured through deposition.

Figure 16:
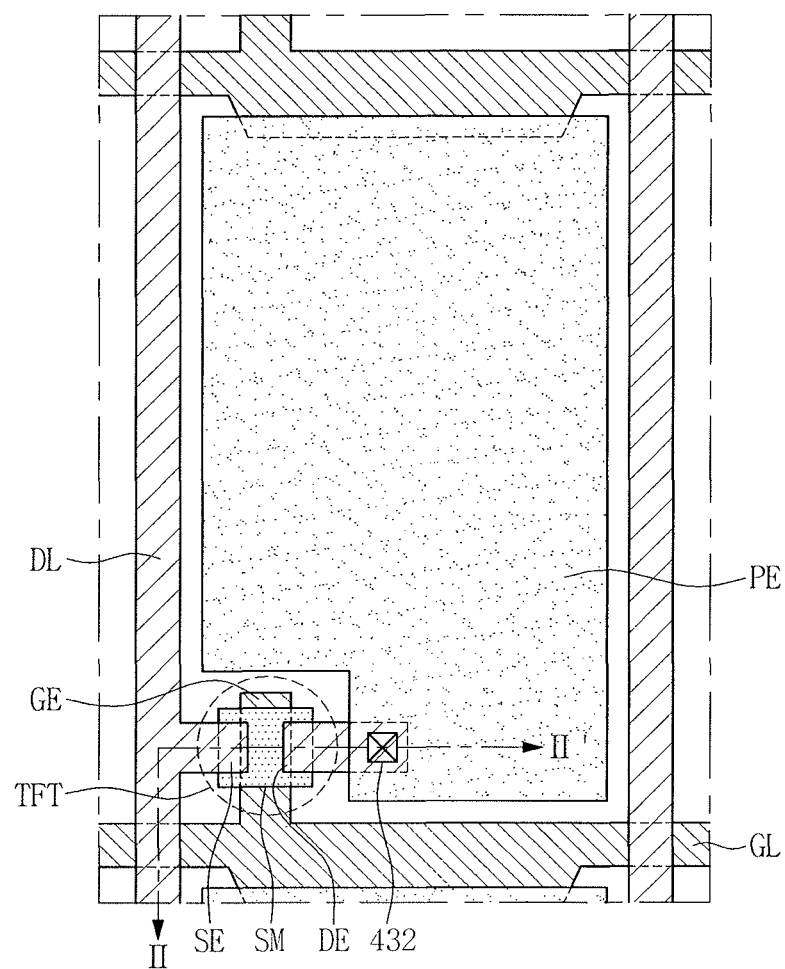
FIG. 16 illustrates a plan view of a liquid crystal display ("LCD") device according to a seventh exemplary embodiment.
Figure 17:
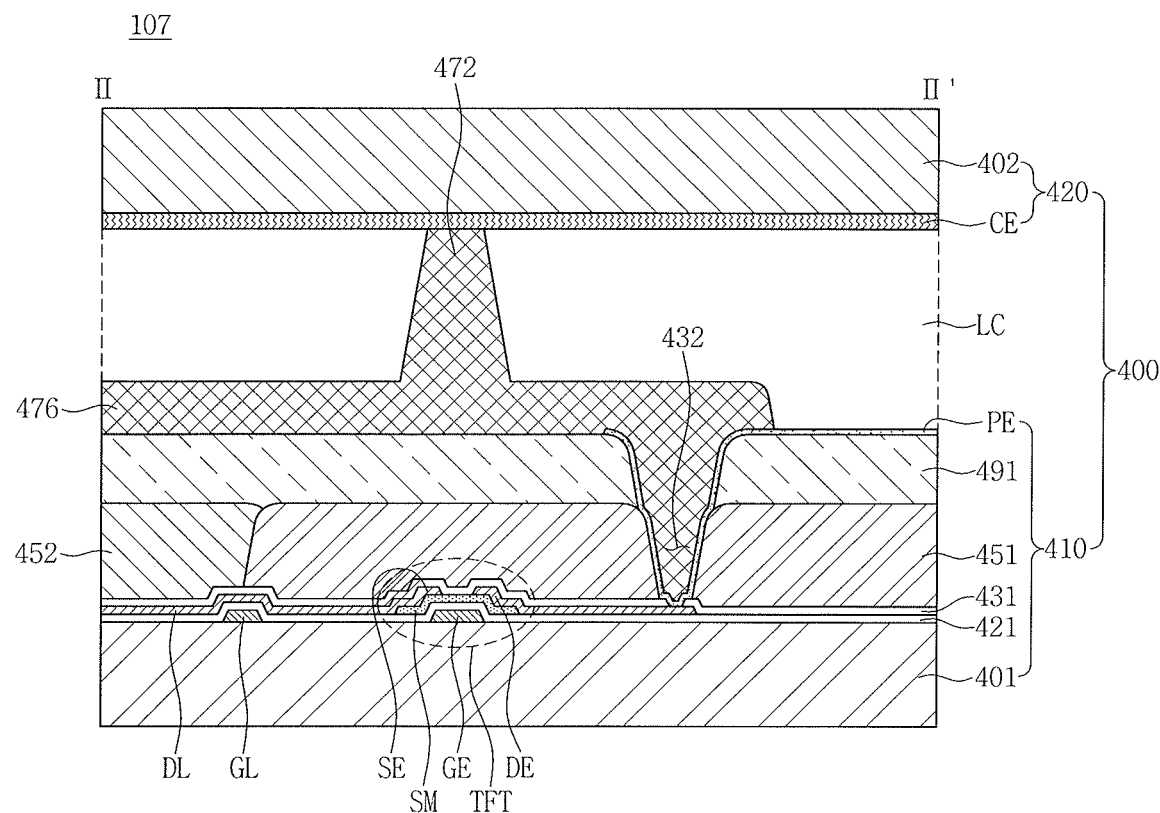
FIG. 17 illustrates a cross-sectional view taken along line II-II' of FIG. 16.

FIG. 16 illustrates a plan view of an LCD device 107 according to a seventh exemplary embodiment. FIG. 17 illustrates a cross-sectional view taken along line II-II' of FIG. 16.

The LCD device 107 according to the seventh exemplary embodiment may include a base substrate 401, a sealing substrate 402 opposing the base substrate 401, and a liquid crystal layer LC between the base substrate 401 and the sealing substrate 402.

For example, the LCD device 107 may include a display substrate 410, an opposing substrate 420, and the liquid crystal layer LC as illustrated in FIGS. 16 and 17.

The display substrate 410 may include the base substrate 401, a gate line GL on the base substrate 401, a data line DL, a TFT, a gate insulating layer 421, an insulating interlayer 431, color filters 451 and 452, a planarization layer 491, a pixel electrode PE, and a light blocking portion 476.

The gate line GL and a gate electrode GE extending from the gate line GL are disposed on the base substrate 401. The gate line GL and the gate electrode GE are disposed on substantially a same layer.

The gate line GL and the gate electrode GE may include or be formed of aluminum (Al) or alloys thereof, silver (Ag) or alloys thereof, copper (Cu) or alloys thereof, and/or molybdenum (Mo) or alloys thereof. In an alternative exemplary embodiment, the gate line GL and the gate electrode GE may include or be formed of one of chromium (Cr), tantalum (Ta), and titanium (Ti). In an alternative exemplary embodiment, the gate line GL and the gate electrode GE may have a multilayer structure including at least two conductive layers that have different physical properties from one another.

The gate insulating layer 421 is disposed on the gate line GL and the gate electrode GE. In such an exemplary embodiment, the gate insulating layer 421 may be disposed over an entire surface of the base substrate 401 including the gate line GL and the gate electrode GE. The gate insulating layer 421 may include silicon nitride ($SiN_x$) or silicon oxide ($SiO_x$). The gate insulating layer 421 may have a multilayer structure including at least two insulating layers that have different physical properties from one another.

A semiconductor layer SM is disposed on the gate insulating layer 421. The semiconductor layer SM overlaps the gate electrode GE, a source electrode SE, and a drain electrode DE. The semiconductor layer SM may include or be formed of amorphous silicon, polycrystalline silicon, or the like. The semiconductor layer SM may include an oxide semiconductor material. An ohmic contact layer may be disposed on the semiconductor layer SM.

The source electrode SE is disposed to overlap a portion of the semiconductor layer SM. The source electrode SE extends from the data line DL. For example, as illustrated in FIG. 16, the source electrode SE has a shape protruding from the data line DL toward the gate electrode GE.

The source electrode SE may include or be formed of a refractory metal, such as molybdenum, chromium, tantalum, and titanium, or an alloy thereof, and may have a multilayer structure including a refractory metal layer and a low-resistance conductive layer. Examples of the multilayer structure may include: a double-layer structure including a chromium or molybdenum (alloy) lower layer and an aluminum (alloy) upper layer; and a triple-layer structure including a molybdenum (alloy) lower layer, an aluminum (alloy) intermediate layer, and a molybdenum (alloy) upper layer. Further, the source electrode SE may include or be formed of any suitable metals or conductors rather than the aforementioned materials.

The drain electrode DE is disposed to overlap a portion of the semiconductor layer SM, spaced apart from the source electrode SE. The drain electrode DE is connected to the pixel electrode PE. The drain electrode DE and the source electrode SE may be simultaneously provided in substantially a same process.

The gate electrode GE, the semiconductor layer SM, the source electrode SE, and the drain electrode DE define the TFT.

A channel area of the TFT is disposed in a portion of the semiconductor layer SM between the source electrode SE and the drain electrode DE.

The data line DL is disposed on the gate insulating layer 421 and intersects the gate line GL. In an implementation, a portion of the data line DL intersecting the gate line GL may have a smaller line width than a line width of another portion of the data line DL. Accordingly, a parasitic capacitance between the data line DL and the gate line GL may be reduced. The data line DL may include substantially a same material and may have substantially a same structure (e.g., a multilayer structure) as those of the source electrode SE. The data line DL and the source electrode SE may be simultaneously provided in substantially a same process.

In an implementation, the semiconductor layer SM may further be disposed between the gate insulating layer 421 and the source electrode SE and between the gate insulating layer 421 and the drain electrode DE. In addition, in an implementation, the semiconductor layer SM may further be disposed between the gate insulating layer 421 and the data line DL.

The insulating interlayer 431 is disposed on the data line DL, the source electrode SE, the drain electrode DE, the semiconductor layer SM, and the gate insulating layer 421. In such an exemplary embodiment, the insulating interlayer 431 may be disposed over an entire surface of the base substrate 401 including the data line DL, the source electrode SE, the drain electrode DE, and the gate insulating layer 421. Referring to FIGS. 16 and 17, the insulating interlayer 431 is defined with a drain contact hole 432. The drain electrode DE is exposed through the drain contact hole 432.

The insulating interlayer 431 may include an inorganic insulating material such as silicon nitride ($SiN_x$) or silicon oxide ($SiO_x$), or may include an organic layer. In an implementation, the insulating interlayer 431 may have a double-layer structure including a lower inorganic layer and an upper organic layer.

The first color filter 451 and the second color filter 452 are disposed on the insulating interlayer 431. An edge of the first and second color filters 451 and 452 may be disposed on the gate line GL, the TFT, and the data line DL. Edges of first and second color filters 451 and 452 that are adjacent to each other may overlap each other. Each of the first and second color filters 451 and 452 has an aperture defined corresponding to the drain electrode DE. Each of the first and second color filters 451 and 452 may include or be formed of a photosensitive organic material.

The first color filter 451 and the second color filter 452 have different colors from each other, and may each be one of a red color filter, a green color filter, a blue color filter, a cyan color filter, a magenta color filter, a yellow color filter, and a white color filter.

In an implementation, the LCD device 107 according to the seventh exemplary embodiment may further include a third color filter. The third color filter may have a different color from colors of the first and second color filters 451 and 452, and may have one of red, green, blue, cyan, magenta, and yellow colors.

In an implementation, the color filters 451 and 452 may be disposed on the sealing substrate 402.

The planarization layer 491 is disposed on the color filters 451 and 452. In such an exemplary embodiment, the planarization layer 491 may be disposed over an entire surface of the base substrate 401 including the color filters 451 and 452 and the insulating interlayer 431. However, referring to FIGS. 16 and 17, the planarization layer 491 may have an aperture defined corresponding to the drain contact hole 432.

The planarization layer 491 serves as a protection layer and serves to planarize a lower portion of the pixel electrode PE. The planarization layer 491 is also referred to as a protection layer. The planarization layer 491 may include an organic material, e.g., a photosensitive organic material or a photosensitive resin composition. In such an exemplary embodiment, the planarization layer 491 may also be referred to as an organic layer.

The pixel electrode PE is connected to the drain electrode DE through the drain contact hole 432. The pixel electrode PE is disposed on the planarization layer 491. A portion of an edge of the pixel electrode PE may overlap the light blocking portion 476.

The pixel electrode PE has light transmittance, and may have substantially a same structure as a structure of one of the electrodes 111, 112, and 113 according to the first, second, and third exemplary embodiments.

The pixel electrode PE may include the first light transmitting layer 120 (the first exemplary embodiment). In addition, the pixel electrode PE may further include the metal layer 130 below the first light transmitting layer 120 (the second exemplary embodiment), and may further include the second light transmitting layer 140 below the metal layer 130 (the third exemplary embodiment). In such an exemplary embodiment, the metal layer 130 may have a thickness ranging from about 3 nm to about 7 nm.

The light blocking portion 476 is disposed on the pixel electrode PE and the planarization layer 491. For example, the light blocking portion 476 overlaps the TFT, the gate lines GL, and the data line DL, and significantly reduces (or prevents) light leakage.

As illustrated in FIG. 17, a column spacer 472 may be disposed on the light blocking portion 476. The column spacer 472 has a shape protruding toward the opposing substrate 420 from the light blocking portion 476 to have a predetermined height. The column spacer 472 maintains a cell gap between the display substrate 410 and the opposing substrate 420.

The column spacer 472 and the light blocking portion 476 may be unitary. In such an exemplary embodiment, the column spacer 472 and the light blocking portion 476 may be simultaneously provided using substantially a same material. The column spacer 472 and the light blocking portion 476 may be collectively referred to as a black column spacer (BCS).

The opposing substrate 420 includes the sealing substrate 402 and a common electrode CE on the sealing substrate 402.

The common electrode CE may have substantially a same structure as a structure of one of the electrodes 111, 112, and 113 according to the first, second, and third exemplary embodiments. The common electrode CE has light transmittance.

The common electrode CE may include the first light transmitting layer 120 (the first exemplary embodiment). In an implementation, the common electrode may further include the metal layer 130 below the first light transmitting layer 120 (the second exemplary embodiment), and may further include the second light transmitting layer 140 below the metal layer 130 (the third exemplary embodiment). In such an exemplary embodiment, the metal layer 130 has a thickness ranging from about 3 nm to about 7 nm.

In such an exemplary embodiment, the first light transmitting layer 120 is disposed toward the liquid crystal layer LC.

In an exemplary embodiment, the color filters 451 and 452 may be disposed on the sealing substrate 402.

The liquid crystal layer LC is disposed between the base substrate 401 and the sealing substrate 402. For example, the liquid crystal layer LC may be disposed in a space defined by the display substrate 410 and the opposing substrate 420.

In addition, a panel including the display substrate 410, the liquid crystal layer LC, and the opposing substrate 420 is also referred to as an LCD panel 400.

In an implementation, the first light transmitting layer 120 may have a refractive index ranging from, e.g., about 1.6 to about 1.9. On the contrary, IZO which is typically used for an electrode of LCD devices has a refractive index of about 2.0 or higher. As such, the first light transmitting layer 120 has a relatively low refractive index.

In an exemplary embodiment, the liquid crystal layer LC typically has a refractive index ranging from about 1.5 to about 1.6.

Accordingly, in a case where the electrodes 111, 112, and 113 including the first light transmitting layer 120 are used as the pixel electrode PE or the common electrode CE of the LCD device and the first light transmitting layer 120 is disposed toward the liquid crystal layer LC, a refractive-index difference between the electrode PE or the common electrode CE and the liquid crystal layer LC is not significantly large such that light reflection may not substantially occur at an interfacial surface between the pixel electrode PE and the liquid crystal layer LC or at an interfacial surface between the common electrode CE and the liquid crystal layer LC. Accordingly, black luminance of the LCD device may decrease, and thus a contrast ratio of the LCD device may advantageously increase.

Figure 18:
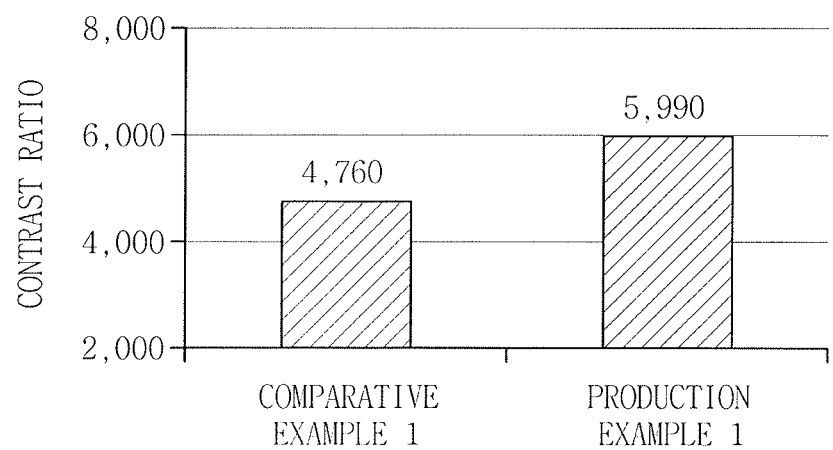
FIG. 18 illustrates a graph of a contrast ratio of an LCD device.

FIG. 18 illustrates a graph of contrast ratios of LCD devices. For example, a contrast ratio of an LCD device in which the electrode according to Comparative Example 1 is used as a pixel electrode and a contrast ratio of an LCD device in which the electrode according to Production Example 1 is used as a pixel electrode are illustrated in FIG. 18.

Referring to FIG. 18, it may be seen that when the electrode according to Production Example 1 was used as a pixel electrode, a contrast ratio of the LCD device was relatively excellent.

Figure 19:
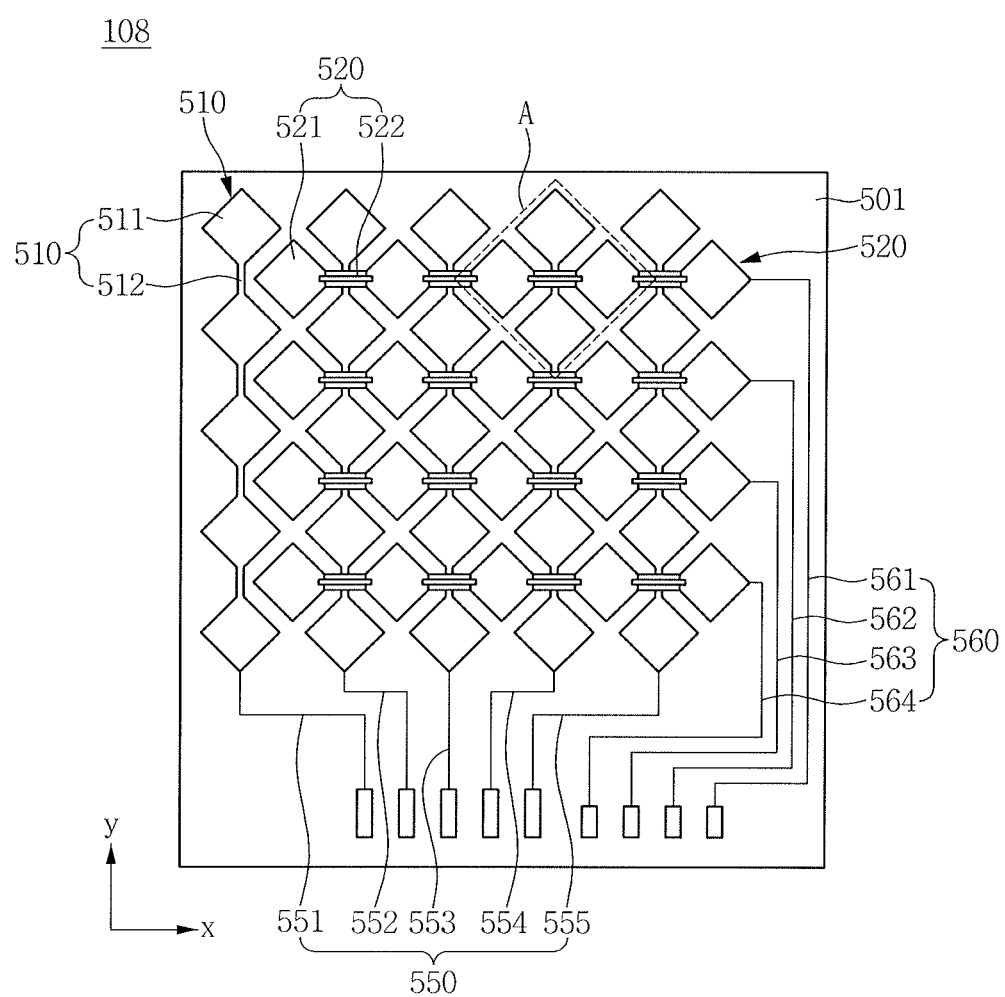
FIG. 19 illustrates a plan view of a touch panel according to an eighth exemplary embodiment.
Figure 20:
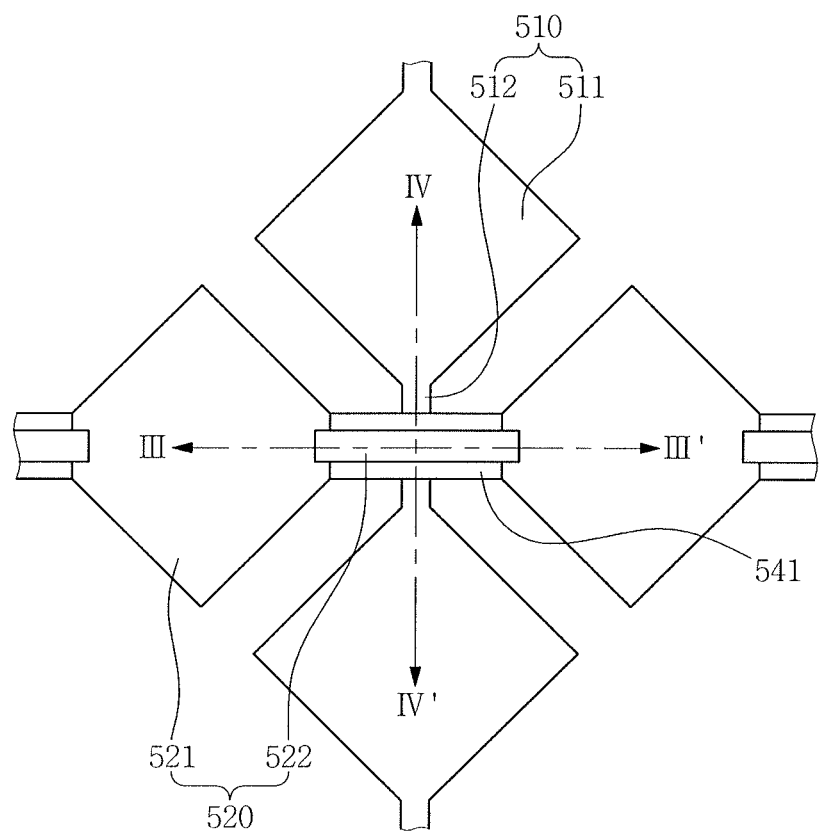
FIG. 20 illustrates an enlarged view of a portion "A" of FIG. 19.
Figure 21:
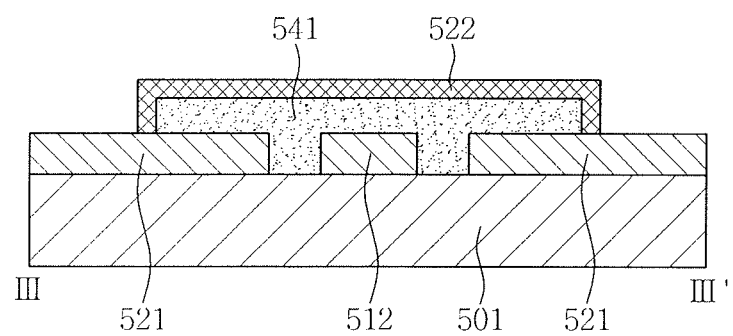
FIG. 21 illustrates a cross-sectional view taken along line of FIG. 20.
Figure 22:
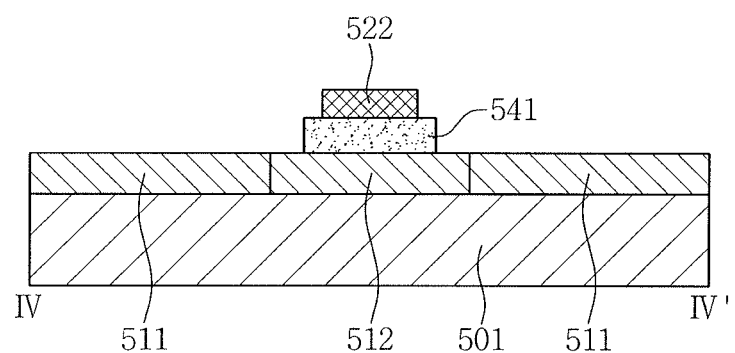
FIG. 22 illustrates a cross-sectional view taken along line IV-IV' of FIG. 20.

FIG. 19 illustrates a plan view of a touch panel 108 according to an eighth exemplary embodiment. FIG. 20 illustrates an enlarged view illustrating a portion "A" of FIG. 19, FIG. 21 illustrates a cross-sectional view taken along line of FIG. 20, and FIG. 22 illustrates a cross-sectional view taken along line IV-IV' of FIG. 20.

The touch panel 108 according to the eighth exemplary embodiment may include a base substrate 501, a plurality of first sensor patterns 510 disposed on the base substrate 501 (e.g., arranged along one direction), and a plurality of second sensor patterns 520, on the base substrate 501, insulated from and intersecting the plurality of first sensor patterns 510. The first and second sensor patterns 510 and 520 are also referred to as a "touch sensor pattern."

At least one of the first sensor pattern 510 and the second sensor pattern 520 may include a first light transmitting layer, and the first light transmitting layer may include a first TCO and a first metal element doped in the first TCO. In such an exemplary embodiment, the first metal element may include, e.g., a group 2 metal element and may be included in an amount of about 0.01 atomic % to about 5.00 atomic %, based on the total number of atoms in the first light transmitting layer.

For example, at least one of the first sensor pattern 510 and the second sensor pattern 520 may have substantially a same structure as a structure of one of the electrodes 111, 112, and 113 according to the first, second, and third exemplary embodiments.

For example, at least one of the first sensor pattern 510 and the second sensor pattern 520 may include the first light transmitting layer 120 (the first exemplary embodiment), may further include the metal layer 130 below the first light transmitting layer 120 (the second exemplary embodiment), and may further include the second light transmitting layer 140 below the metal layer 130 (the third exemplary embodiment). In an implementation, the metal layer 130 has a thickness ranging from about 3 nm to about 7 nm. The first sensor pattern 510 and the second sensor pattern 520 have light transmittance.

As the first light transmitting layer 120 has low sheet resistance, only the first light transmitting layer 120 may form the first sensor pattern 510 and the second sensor pattern 520. In addition, although having a small thickness, the first sensor pattern 510 and the second sensor pattern 520 may have excellent electrical conductivity. Accordingly, the touch panel 108 may have a small thickness. The touch panel 108 having a small thickness may be useful for a flexible display device.

In addition, when the first sensor pattern 510 and the second sensor pattern 520 have a small thickness, a moire phenomenon may be reduced in the touch panel 108.

Referring to FIGS. 19 and 20, the plurality of first sensor patterns 510 are disposed along a first direction, and the plurality of second sensor patterns 520 are disposed along a second direction. Referring to FIG. 19, the first direction is a y-axis direction, and the second direction is an x-axis direction. In an implementation, the first direction and the second direction may be interchangeable.

The first sensor pattern 510 may include a plurality of first sensor electrodes 511 and a first bridge 512 connecting adjacent ones of the first sensor electrodes 511. The second sensor pattern 520 includes a plurality of second sensor electrodes 521 and a second bridge 522 connecting adjacent ones of the second sensor electrodes 521.

The first bridge 512 and the second bridge 522 are insulated from and intersecting each other, e.g., the first bridge 512 is insulated from and intersects the second bridge 522. To this end, an insulating layer 541 is disposed between the first bridge 512 and the second bridge 522.

The first sensor electrode 511, the first bridge 512, the second sensor electrode 521, and the second bridge 522 may include substantially a same material or may include different materials.

The base substrate 501 may include a material that is transparent and may provide supporting force. The base substrate 501 may use a polyethylene terephthalate (PET) film, a polycarbonate (PC) film, a polymethyl methacrylate (PMMA) film, a polyethylene naphthalate (PEN) film, a polyethersulfone (PES) film, a triacetylcellulose (TAC) film, a polyvinyl alcohol (PVA) film, a polyimide (PI) film, a polystyrene (PS) film, or glass, for example. In addition, a substrate or a window of a display device may become the base substrate 501 of the touch panel 108.

For example, the first sensor pattern 510 and the second sensor pattern 520 may be directly formed on a base substrate or a window of display devices.

The first sensor pattern 510, along with the second sensor pattern 520, is configured to generate a signal based on a touch of a user. The first sensor pattern 510 and the second sensor pattern 520 may be provided on the base substrate 501, having a plurality of linear shapes. In an implementation, five first sensor patterns 510 and four second sensor patterns 520 may be included, as illustrated in FIG. 19. In an implementation, the touch panel 108 may include five to twenty first sensor patterns 510 and five to twenty second sensor patterns 520, or may include twenty or more first sensor patterns 510 and twenty or more second sensor patterns 520.

In FIG. 19, it is illustrated that the first sensor pattern 510 and the second sensor pattern 520 orthogonally intersect each other.

In an implementation, the first sensor electrode 511 may have a lozenge shape, as illustrated in FIGS. 19 and 20. In an implementation, the first sensor electrode 511 may have a rectangular shape, an octagonal shape, or a circular shape.

The first bridge 512 is disposed to intersect the second bridge 522. The first sensor electrode 511 and the first bridge 512 may include substantially a same material and may be simultaneously patterned.

In an implementation, the second sensor electrode 521, similar to the first sensor electrode 511, may have a lozenge shape, a rectangular shape, an octagonal shape, or a circular shape. The second sensor electrode 521 and the second bridge 522 may include substantially a same material and may be simultaneously patterned.

The insulating layer 541 may include a transparent insulating material. The insulating layer 541 may include substantially a same material as a material included in the base substrate 501.

Lead lines 550 and 560 configured to receive electric signals respectively applied from the first sensor pattern 510 and the second sensor pattern 520 are disposed at respective one ends of the first sensor pattern 510 and the second sensor pattern 520.

Referring to FIG. 19, lead lines 551, 552, 553, 554, and 555 each extending from an end of the first sensor pattern 510 extend toward a lower portion of the base substrate 501. In addition, lead lines 561, 562, 563, and 564 each extending from an end of the second sensor pattern 520 extend toward a side surface of the base substrate 501 to further extend toward a lower portion of the base substrate 501.

The lead lines 550 and 560 include a conductive material.

In an implementation, the lead lines 550 and 560 (as illustrated in FIG. 19) may be connected to respective one ends of the first sensor pattern 510 and the second sensor pattern 520. Based on a driving method of the touch panel 108, the lead lines 550 and 560 may be connected to opposite ends of the first sensor pattern 510 and opposite ends of the second sensor pattern 520, respectively.

By way of summation and review, in order to form a transparent electrode, TCOs having excellent light transmittance, low resistance, and excellent pattern-forming characteristics have been considered.

As set forth above, according to one or more exemplary embodiments, an exemplary embodiment of an electrode includes a light transmitting layer having excellent light transmittance, low resistance, high work function, and excellent pattern-forming characteristics. Such an electrode may be used as an anode of an OLED display device, a transparent electrode of an LCD device, and a touch sensor pattern of a touch panel.

The embodiments may provide an electrode including a light transmitting layer having excellent light transmittance, low resistance, and excellent pattern-forming characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display substrate, comprising:
a base substrate; and
an electrode on the base substrate, the electrode including a first light transmitting layer, the first light transmitting layer including a first transparent conductive oxide (TCO) layer that includes two different metal oxides and has a work function ranging from about 4.75 eV to about 4.9 eV,
wherein the first transparent conductive oxide layer is doped with a group 2 metal element in an amount of about 0.01 atomic percent (atomic %) to about 5.00 atomic %, based on a total number of atoms in the first transparent conductive oxide layer.

2. The display substrate as claimed in claim 1, wherein the first transparent conductive oxide layer includes at least one of indium tin oxide (ITO), indium zinc oxide (IZO), zinc oxide (ZnO), aluminum zinc oxide (AZO), or indium oxide ($In_2O_3$).

3. The display substrate as claimed in claim 1, wherein, based on a total weight of the first transparent conductive oxide layer, the first transparent conductive oxide layer includes:
about 85 percentage by weight (wt %) to about 95 wt % of $In_2O_3$, and
about 5 wt % to about 15 wt % of $SnO_2$.

4. The display substrate as claimed in claim 1, wherein the group 2 metal element includes at least one of Be, Mg, or Ca.

5. The display substrate as claimed in claim 1, wherein the first light transmitting layer has a sheet resistance ranging from about 30 Ω/square to about 55.0 Ω/square.

6. The display substrate as claimed in claim 1, wherein the first light transmitting layer has a thickness ranging from about 5 nanometers (nm) to about 10 nm.

7. The display substrate as claimed in claim 1, wherein the first light transmitting layer has a refractive index ranging from about 1.6 to about 1.9.

8. The display substrate as claimed in claim 1, wherein the first light transmitting layer has a transmittance ranging from about 90 percent (%) to about 99%.

9. The display substrate as claimed in claim 1, wherein:
the electrode further includes a metal layer between the base substrate and the first light transmitting layer, and
the metal layer includes a metal or a metal alloy.

10. The display substrate as claimed in claim 9, wherein the metal layer includes silver (Ag).

11. The display substrate as claimed in claim 10, wherein the metal layer further includes zinc (Zn), copper (Cu), antimony (Sb), or indium (In).

12. The display substrate as claimed in claim 9, wherein the metal layer has a thickness ranging from about 3 nm to about 7 nm.

13. The display substrate as claimed in claim 9, wherein:
the electrode further includes a second light transmitting layer between the base substrate and the metal layer,
the second light transmitting layer includes a second transparent conductive oxide layer and a second metal element doped in the second transparent conductive oxide layer,
the second metal element is a group 2 metal element, and
the second metal element is included in the second light transmitting layer in an amount of about 0.01 atomic % to about 5.00 atomic %, based on a total number of atoms in the second light transmitting layer.

14. The display substrate as claimed in claim 13, wherein the second light transmitting layer has a thickness ranging from about 5 nm to about 10 nm.

15. An organic light emitting diode including the display substrate as claimed in claim 1, wherein the electrode is an anode of the organic light emitting diode.

16. A display device, comprising:
a base substrate; and
a first electrode on the base substrate, the first electrode including a first light transmitting layer,
wherein:
the first light transmitting layer has a work function ranging from about 4.75 eV to about 4.9 eV,
the first light transmitting layer includes a first transparent conductive oxide (TCO) layer and a first metal element doped in the first transparent conductive oxide layer,
the first metal element being a group 2 metal element,
the first metal element is included in the first light transmitting layer in an amount of about 0.01 atomic percent (atomic %) to about 5.00 atomic %, based on a total number of atoms in the first light transmitting layer, and
the group 2 metal element includes Be or Mg.

17. The display device as claimed in claim 16, wherein:
the first electrode further includes a metal layer between the base substrate and the first light transmitting layer, and
the metal layer includes a metal or a metal alloy.

18. The display device as claimed in claim 17, wherein:
the first electrode further includes a second light transmitting layer between the base substrate and the metal layer,
the second light transmitting layer includes a second transparent conductive oxide layer and a second metal element doped in the second transparent conductive oxide layer,
the second metal element is a group 2 metal element, and
the second metal element is included in the second light transmitting layer in an amount of about 0.01 atomic % to about 5.00 atomic %, based on a total number of atoms in the second light transmitting layer.

19. The display device as claimed in claim 16, further comprising:
a light emitting layer on the first electrode; and
a second electrode on the light emitting layer.

20. The display device as claimed in claim 19, wherein the first electrode is an anode.

21. The display device as claimed in claim 19, further comprising a thin film encapsulation layer on the second electrode.

22. The display device as claimed in claim 16, wherein the base substrate is a flexible substrate.

23. The display device as claimed in claim 16, further comprising:
an opposing substrate opposing the base substrate; and
a liquid crystal layer between the base substrate and the opposing substrate.

24. A touch panel, comprising:
a base substrate;
a plurality of first sensor patterns on the base substrate and arranged along a direction; and
a plurality of second sensor patterns on the base substrate, the plurality of second sensor patterns being insulated from and intersecting the first sensor pattern,
wherein:
the first sensor pattern or the second sensor pattern includes a first light transmitting layer,
the first light transmitting layer includes a first transparent conductive oxide layer including:
a first transparent conductive oxide (TCO) layer that includes two different metal oxides and has a work function ranging from about 4.75 eV to about 4.9 eV, and
a first metal element doped in the first transparent conductive oxide layer layer in an amount of about 0.01 atomic percent (atomic %) to about 5.00 atomic %, based on a total number of atoms in the first transparent conductive oxide layer.

25. The touch panel as claimed in claim 24, wherein:
the first sensor pattern includes a plurality of first sensor electrodes and a first bridge connecting adjacent ones of the first sensor electrodes,
the second sensor pattern includes a plurality of second sensor electrodes and a second bridge connecting adjacent ones of the second sensor electrodes, and
the first bridge is insulated from and intersects the second bridge.

* * * * *